(12) United States Patent
Higo et al.

(10) Patent No.: US 10,706,903 B2
(45) Date of Patent: Jul. 7, 2020

(54) NONVOLATILE MEMORY CELL, MEMORY CELL UNIT, AND INFORMATION WRITING METHOD, AND ELECTRONIC APPARATUS

(71) Applicant: SONY CORPORATION, Tokyo (JP)

(72) Inventors: Yutaka Higo, Kanagawa (JP);
Masanori Hosomi, Tokyo (JP);
Hiroyuki Ohmori, Kanagawa (JP);
Kazuhiro Bessho, Kanagawa (JP);
Hiroyuki Uchida, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/301,063

(22) PCT Filed: Apr. 18, 2017

(86) PCT No.: PCT/JP2017/015610
§ 371 (c)(1),
(2) Date: Nov. 13, 2018

(87) PCT Pub. No.: WO2017/208653
PCT Pub. Date: Dec. 7, 2017

(65) Prior Publication Data
US 2019/0189172 A1 Jun. 20, 2019

(30) Foreign Application Priority Data
May 31, 2016 (JP) .................................. 2016-108494

(51) Int. Cl.
*G11C 11/16* (2006.01)
*H01L 29/82* (2006.01)
(Continued)

(52) U.S. Cl.
CPC ............ *G11C 11/161* (2013.01); *G11C 11/16* (2013.01); *G11C 11/1659* (2013.01);
(Continued)

(58) Field of Classification Search
CPC .............. G11C 11/161; G11C 11/1659; G11C 11/1675; G11C 11/16; H01L 27/228;
(Continued)

(56) References Cited

U.S. PATENT DOCUMENTS 7,372,722 B2* 5/2008 Jeong ...................... G11C 11/15
365/158
9,218,864 B1* 12/2015 Yi ......................... G11C 11/161
(Continued)

FOREIGN PATENT DOCUMENTS

EP 2242097 A1 10/2010
EP 2375464 A1 10/2011
(Continued)

OTHER PUBLICATIONS

International Search Report and Written Opinion of PCT Application No. PCT/JP2017/015610, dated Jul. 11, 2017, 10 pages of ISRWO.

*Primary Examiner* — Khamdan N. Alrobaie
(74) *Attorney, Agent, or Firm* — CHIP Law Group

(57) ABSTRACT

A nonvolatile memory cell includes a layered structure body formed by layering a storage layer that stores information in accordance with a magnetization direction and a magnetization fixed layer that defines a magnetization direction of the storage layer; and a heating layer that heats the magnetization fixed layer to control a magnetization direction of the magnetization fixed layer.

16 Claims, 17 Drawing Sheets

(51) Int. Cl.
*H01L 43/08* (2006.01)
*H01L 27/22* (2006.01)
*H01L 43/02* (2006.01)
*H01F 10/32* (2006.01)

(52) U.S. Cl.
CPC ........ *G11C 11/1675* (2013.01); *H01L 27/228* (2013.01); *H01L 29/82* (2013.01); *H01L 43/02* (2013.01); *H01L 43/08* (2013.01); *H01F 10/329* (2013.01); *H01F 10/3286* (2013.01)

(58) Field of Classification Search
CPC ..... H01L 43/02; H01L 21/8239; H01L 43/08; H01L 27/105; H01L 29/82; H01F 10/3286; H01F 10/329
See application file for complete search history.

(56) References Cited

U.S. PATENT DOCUMENTS

| | | | |
|---|---|---|---|
| 2004/0136235 A1* | 7/2004 | Ohmori | G11C 11/16 365/173 |
| 2005/0002228 A1* | 1/2005 | Dieny | B82Y 25/00 365/171 |
| 2011/0063899 A1 | 3/2011 | Ogimoto | |
| 2011/0108937 A1* | 5/2011 | Reid | B82Y 25/00 257/421 |
| 2011/0310660 A1 | 12/2011 | Yamada et al. | |
| 2012/0001281 A1 | 1/2012 | Yamane et al. | |
| 2012/0230089 A1* | 9/2012 | Yamada | G11C 11/16 365/158 |

FOREIGN PATENT DOCUMENTS

| | | |
|---|---|---|
| EP | 2479787 A1 | 7/2012 |
| JP | 2012-015312 A | 1/2012 |
| JP | 5057254 B2 | 10/2012 |
| JP | 5440509 B2 | 3/2014 |
| JP | 5578448 B2 | 8/2014 |
| WO | 2009/098796 A1 | 8/2009 |
| WO | 2010/073790 A1 | 7/2010 |
| WO | 2011/033873 A1 | 3/2011 |

* cited by examiner

NONVOLATILE MEMORY CELL, MEMORY CELL UNIT, AND INFORMATION WRITING METHOD, AND ELECTRONIC APPARATUS

CROSS REFERENCE TO RELATED APPLICATIONS

This application is a U.S. National Phase of International Patent Application No. PCT/JP2017/015610 filed on Apr. 18, 2017, which claims priority benefit of Japanese Patent Application No. JP 2016-108494 filed in the Japan Patent Office on May 31, 2016. Each of the above-referenced applications is hereby incorporated herein by reference in its entirety.

TECHNICAL FIELD

The present disclosure relates to a nonvolatile memory cell, more specifically, a nonvolatile memory cell including a magnetoresistive element, a memory cell unit including the nonvolatile memory cell, an information writing method in the memory cell unit, and an electronic apparatus including the memory cell unit.

BACKGROUND ART

A magnetic random access memory (MRAM) can perform high-speed and substantially infinite ($10^{15}$ times or more) rewriting because data is stored on the basis of a magnetization direction of a magnetic body, and the MRAM is already used in the fields of industrial automation, airplanes, and the like. Additionally, the MRAM is expected to have further development in code storage and a working memory in future because of its high-speed operation and high reliability, but in reality, there is a problem in reducing electric power consumption and increasing capacity. This is a substantive problem originated from a recording principle of the MRAM, more specifically, a method in which magnetization is reversed by a current magnetic field generated from wiring.

As a method to solve the above-described problem, a recording method without using the current magnetic field, more specifically, a magnetization reversal method is studied, and particularly, attention is paid to a spin transfer torque based magnetic random access memory (STT-MRAM) that applies magnetization reversal by spin injection (refer to, for example, Japanese Patent Application Laid-Open No. 2014-072393).

The magnetization reversal by spin injection is a phenomenon in which electrons that have been spin-polarized by passing through a magnetic body are injected into the other magnetic body, thereby causing magnetization reversal in the other magnetic body. Compared to the MRAM in which magnetization reversal is performed on the basis of an external magnetic field by utilizing magnetization reversal by spin injection, the spin transfer torque based magnetic random access memory has advantages in which: write current is not increased even when a device size is miniaturized; scaling can be performed because a write current value is reduced in proportion to the volume of the device; a cell area can be reduced, and furthermore, there is an additional advantage in which a device structure and a cell structure are simplified because a word line used to generate recording current magnetic field that is required in the MRAM is unnecessary.

FIG. 4 illustrates an equivalent circuit diagram of a nonvolatile memory cell including: a spin transfer torque based magnetic random access memory that is two-terminal element; and a selection transistor that is a three-terminal element including a gate electrode and source/drain regions. The spin transfer torque based magnetic random access memory includes, for example, a magnetic tunnel junction element (MTJ element) and has at least two magnetic layers (specifically, a storage layer and a magnetization fixed layer). In the magnetization fixed layer, a magnetization direction is fixed. On the other hand, in the storage layer (free layer), the magnetization direction is varied, and information "1" or "0" is stored depending on the magnetization direction. The spin transfer torque based magnetic random access memory has one end connected to one of the source/drain regions (referred to as "drain region" for convenience sake) of the selection transistor TR and has the other end connected to a bit line BL. Additionally, the selection transistor TR has the other one of the source/drain regions (referred to as "source region" for convenience sake) connected to a sense line 65. Furthermore, when current is made to flow from the bit line BL to the sense line 65 or by current is made to flow from the sense line 65 to the bit line BL, magnetization direction of the storage layer is reversed by spin injection in accordance with a flow direction of the current.

In the spin transfer torque based magnetic random access memory utilizing such magnetization reversal by spin injection, voltage and current applied to the spin transfer torque based magnetic random access memory at the time of writing information are determined by drive capacity of the selection transistor. Meanwhile, the drive current in the selection transistor has an asymmetry property in which, for example, a value of flowing current is different between a case where the current flows from the drain region to the source region and a case where the current flows from the source region to the drain region.

FIG. 14A illustrates an equivalent circuit diagram in "writing-1" in which current flows from a sense line to a bit line via the selection transistor and the spin transfer torque based magnetic random access memory, and a relation between voltage applied to the spin transfer torque based magnetic random access memory and the current flowing in the spin transfer torque based magnetic random access memory and the selection transistor. Additionally, FIG. 14B illustrates an equivalent circuit diagram in "writing-2" in which current flows from the bit line to the sense line via the spin transfer torque based magnetic random access memory and the selection transistor, and a relation between the voltage applied to the spin transfer torque based magnetic random access memory and the current flowing in the spin transfer torque based magnetic random access memory and the selection transistor. In each of FIGS. 14A and 14B, a vertical axis represents the current (unit: microampere) flowing in the spin transfer torque based magnetic random access memory and the selection transistor, and a horizontal axis represents the voltage applied to the spin transfer torque based magnetic random access memory (unit: volt). In FIGS. 14A and 14B, assume that: the spin transfer torque based magnetic random access memory is represented as "MTJ"; and the selection transistor includes NMOS. In the example illustrated in FIG. 14A, $V_{dd}$ (for example, 1.0 volt, and the similar voltage is applied in the following description) is applied to a sense line (source region), and a bit line is grounded. On the other hand, in the example illustrated in FIG. 14B, $V_{dd}$ is applied to the bit line, and the sense line (source region) is grounded. Additionally, in both cases of writing, the selection transistor is made to a conductive state by applying the power supply voltage $V_{dd}$ to a gate electrode of the selection transistor, and current is made to flow in the spin transfer torque based magnetic random access memory via the selection transistor. At this point, a current direction is changed depending on whether the power supply voltage $V_{dd}$ is applied to the sense line or applied to the bit line, and desired information can be written in the spin transfer torque based magnetic random access memory.

Here, a gate potential is fixed at $V_{dd}$. Additionally, in the case of "writing-1", a potential of the drain region has a value between $V_{dd}$ and $V_{GND}$, specifically, $\Delta V$ because of voltage drop ($\Delta V$) in the spin transfer torque based magnetic random access memory. Therefore, a potential difference $\Delta V_1$ between the gate electrode and the drain region becomes ($V_{dd}$-$\Delta V$). On the other hand, in the case of "writing-2", a potential of the source region is fixed at $V_{GND}$, and a potential difference $\Delta V_2$ between the gate electrode and the source region becomes $V_{dd}$.

CITATION LIST

Patent Document

Patent Document 1: Japanese Patent Application Laid-Open No. 2014-072393

SUMMARY OF THE INVENTION

Problems to be Solved by the Invention

As described above, compared to a case of "writing-1" with a case of "writing-2", obtained is $|\Delta V_1|<|\Delta V_2|$ in which a potential difference to determine drive current is more reduced in the case of "writing-1", and as a result, the drive current is reduced. More specifically, compared to information writing in the case of "writing-2", a current amount flowing in a spin transfer torque based magnetic random access memory is more reduced in "writing-1", thereby causing a disadvantageous state. Thus, in information writing in the conventional spin transfer torque based magnetic random access memory, drive capacity of a drive transistor is changed depending on information to be written. Additionally, it is necessary to upsize a selection transistor in order to secure appropriate write current even in the case of the disadvantageous state (more specifically, case of "writing-1), and there is a problem that a cell area is increased".

Therefore, the present disclosure is directed to providing: a nonvolatile memory cell (magnetoresistive effect element) having a configuration and a structure enabling information writing by making current flow in a single direction without making current flow bidirectionally in a selection transistor; a memory cell unit including the nonvolatile memory cell; an information writing method in the memory cell unit, and an electronic apparatus including the memory cell unit.

Solutions to Problems

A memory cell unit of the present disclosure to achieve the above-described object is a memory cell unit formed by arraying a plurality of nonvolatile memory cells in a two-dimensional matrix in a first direction and a second direction different from the first direction,
in which each of the nonvolatile memory cells includes: a layered structure body formed by layering a storage layer that stores information in accordance with a magnetization direction and a magnetization fixed layer that defines a magnetization direction of the storage layer; and a heating layer that heats the magnetization fixed layer to control a magnetization direction of the magnetization fixed layer.

A nonvolatile memory cell of the present disclosure to achieve the above-described object includes: a layered structure body formed by layering a storage layer that stores information in accordance with a magnetization direction and a magnetization fixed layer that defines the magnetization direction of the storage layer; and a heating layer that heats the magnetization fixed layer to control a magnetization direction of the magnetization fixed layer.

An information writing method of the present disclosure to achieve the above-described object is an information writing method in a memory cell unit formed by arraying a plurality of nonvolatile memory cells in a two-dimensional matrix in a first direction and a second direction different from the first direction, and
each of the nonvolatile memory cells including a layered structure body formed by layering a storage layer that stores information in accordance with a magnetization direction and a magnetization fixed layer that defines a magnetization direction of the storage layer, and
the information writing method includes writing, in the storage layer, information based on a magnetization direction of the magnetization fixed layer by controlling the magnetization direction of the magnetization fixed layer by heating the magnetization fixed layer.

An electronic apparatus of the present disclosure to achieve the above object includes the memory cell unit of the present disclosure.

Effects of the Invention

In the nonvolatile memory cell of the present disclosure, the nonvolatile memory cell constituting the memory cell unit of the present disclosure, the nonvolatile memory cell in the information writing method of the present disclosure, and the nonvolatile memory cell provided in the electronic apparatus of the present disclosure, the heating layer that controls the magnetization direction of the magnetization fixed layer by heating the magnetization fixed layer is provided, and information of either "1" or "0" is written in the nonvolatile memory cell by heating the magnetization fixed layer. More specifically, the information of either one of "1" or "0" can be written by making current flow in a single direction without making the current flow bidirectionally in the selection transistor. In other words, normal spin injection writing is not performed, and collective writing by a magnetic field of the magnetization fixed layer is performed in a direction of the write current having low drive capacity of the selection transistor. On the other hand, normal spin injection writing is performed in a direction of the write current having high drive capacity of the selection transistor. Therefore, it is possible to avoid a problem that: the selection transistor is needed to be upsized due to an asymmetry property in which, for example, there is a difference between values of the current flowing in the selection transistor; and a cell area is increased. Additionally, large electric power is not required because the magnetic field of the magnetization fixed layer is utilized for magnetization reversal of the storage layer at the time of collective writing. Note that the effects recited in the present specification are only examples and not limited thereto, and furthermore, an additional effect may also be provided.

MODE FOR CARRYING OUT THE INVENTION

Figure 1A:
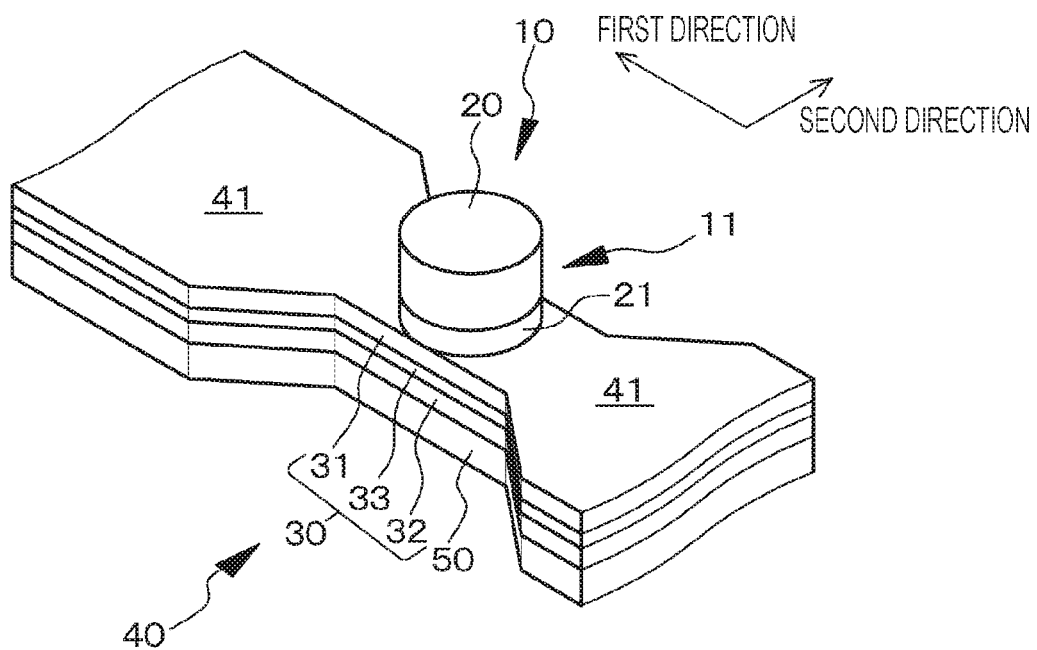
FIG. 1A and FIG. 1B are respectively a schematic perspective view of a nonvolatile memory cell of Embodiment 1 and a diagram schematically illustrating an arrangement state of a layered structure body and a heating layer.

In the following, the present disclosure will be described on the basis of Embodiments with reference to the drawings, but note that the present disclosure is not limited to such Embodiments and various kinds of values and materials in Embodiments are examples. Note that a description will be provided in the following order.

1. General Description of Nonvolatile Memory Cell, Memory Cell Unit, Information Writing Method, and Electronic Apparatus of Present Disclosure 2. Embodiment 1 (Nonvolatile Memory Cell, Memory Cell Unit, and Information Writing Method)

3. Embodiment 2 (Modification of Embodiment 1)

4. Embodiment 3 (Modification of Embodiments 1 to 2)

5. Others

<General Description of Nonvolatile Memory Cell, Memory Cell Unit, Information Writing Method, and Electronic Apparatus of Present Disclosure>

In a memory cell unit of the present disclosure or the memory cell unit provided in an electronic apparatus of the present disclosure, it is possible to have a form in which a heating layer includes at least a part of a magnetization fixed layer, heating layers constituting respective nonvolatile memory cells are connected by heating layer extended portions respectively in a group of the nonvolatile memory cells arrayed along a first direction, and the heating layer extended portion has a layer structure same as that of the heating layer. Additionally, in the nonvolatile memory cell of the present disclosure, it is possible to have a form in which a heating layer includes at least a part of a magnetization fixed layer, heating layers constituting the nonvolatile memory cells are connected by heating layer extended portions respectively between the nonvolatile memory cells adjacent along one direction, and the heating layer extended portion has a layer structure same as that of the heating layer.

Alternatively, in the memory cell unit of the present disclosure or the memory cell unit provided in the electronic apparatus of the present disclosure, it is possible to have a form in which a heating layer is provided in contact with a magnetization fixed layer, and heating layers constituting respective nonvolatile memory cells are connected by heating layer extended portions in a group of the nonvolatile memory cells arrayed along the first direction. Additionally, in the nonvolatile memory cell of the present disclosure, it is possible to have a form in which a heating layer is provided in contact with a magnetization fixed layer, and heating layers constituting nonvolatile memory cells are connected by a heating layer extended portion between the nonvolatile memory cells adjacent along one direction.

Additionally, in the memory cell unit of the present disclosure, the memory cell unit provided in the electronic apparatus of the present disclosure, or in the above-described preferable forms in the nonvolatile memory cell of the present disclosure, it is possible to have a form in which a heating layer has a maximum width narrower than an average width of the heating layer extended portions, and consequently, density of current flowing in the heating layer can be increased, and as a result, a magnetization fixed layer can be surely heated, and furthermore, the heating layer and the heating layer extended portion can also function as a bit line.

In an information writing method of the present disclosure, it is possible to have a form in which each nonvolatile memory cell includes a heating layer including at least a part of a magnetization fixed layer constituting a layered structure body, heating layers constituting respective nonvolatile memory cells are connected by heating layer extended portions respectively in a group of the nonvolatile memory cells arrayed along a first direction, the heating layer extended portion has a layer structure same as that of the heating layer, and the magnetization fixed layer is heated by making current flow in the heating layer and the heating layer extended portion. Alternatively, it is possible to have a form in which each nonvolatile memory cell includes a heating layer provided in contact with a magnetization fixed layer constituting a layered structure body heating layers constituting respective nonvolatile memory cells are connected by heating layer extended portions in a group of the nonvolatile memory cells arrayed along the first direction, and the magnetization fixed layer is heated by making current flow in the heating layer and the heating layer extended portion. Furthermore, in these cases, it is possible to have a form in which a heating layer has a maximum width narrower than an average width of the heating layer extended portions, and as a result, the magnetization fixed layer can be surely heated, and furthermore, in these cases, the heating layer and the heating layer extended portion can also function as a bit line.

Moreover, in the information writing method of the present disclosure including the above-described various preferable forms, it is possible to have a form in which first information can be collectively written in the group of the nonvolatile memory cells arrayed along the first direction by heating the magnetization fixed layer, and furthermore, heating of the magnetization fixed layer by the heating layer is stopped after the first information is collectively written in the group of the nonvolatile memory cells arrayed along the first direction, and second information is written in a desired nonvolatile memory cell in the group of the nonvolatile memory cells arrayed along the first direction.

Furthermore, in the memory cell unit of the present disclosure, the memory cell unit provided in the electronic apparatus of the present disclosure, the nonvolatile memory cell of the present disclosure, and the information writing method of the present disclosure, which include the above-described preferable forms, it is possible to have a form in which an intermediate layer is provided between a magnetization fixed layer and a storage layer, the magnetization fixed layer includes a layered structure in which a first fixed layer, a nonmagnetic layer, and a second fixed layer are layered from the intermediate layer side, the first fixed layer and the second fixed layer have antiferromagnetic coupling, and the first fixed layer has coercive force different from coercive force of the second fixed layer at the time of heating the magnetization fixed layer. Additionally, in this case, it is possible to have a form in which the antiferromagnetic coupling between the first fixed layer and the second fixed layer is uncoupled by heating the magnetization fixed layer, and a magnetization direction of the first fixed layer, a magnetization direction of the second fixed layer become the same direction (same orientation), and furthermore, a magnetization direction of a fixed layer having the larger coercive force out of the first fixed layer and the second fixed layer and a magnetization direction of the storage layer become the same direction (same orientation). Alternatively, in this case, it is possible to have a form in which the antiferromagnetic coupling between the first fixed layer and the second fixed layer is uncoupled by the heating the magnetization fixed layer, and a magnetization direction of the first fixed layer, a magnetization direction of the second fixed layer, and a magnetization direction of the storage layer become the same direction (same orientation), and furthermore, a magnetization direction of a fixed layer having the larger coercive force out of the first fixed layer and the second fixed layer and the magnetization direction of the storage layer become the same direction (same orientation). Here, the wording "the magnetization directions become the same direction" includes not only a state in which magnetization directions are parallel but also a state in which the magnetization directions depart from the parallel state. More specifically, as described later, the magnetization direction of the first fixed layer or the second fixed layer is a magnetization direction to be a reference of information to be stored in the storage layer, and information "0" and information "1" are defined by a relative angle between the magnetization direction of the storage layer and the magnetization direction of the first fixed layer or that of the second fixed layer, but as far as the information "0" and the information "1" are thus defined, the magnetization direction of the first fixed layer or that of the second fixed layer and the magnetization direction of the storage layer are regarded as the same direction. The similar is applied to the following description.

Additionally, in the memory cell unit of the present disclosure, the memory cell unit provided in the electronic apparatus of the present disclosure, the nonvolatile memory cell of the present disclosure, and the information writing method of the present disclosure, which include the above-described preferable form, it is possible to have a configuration in which each nonvolatile memory cell can further include a selection transistor including a field effect transistor such as a known MIS type FET or MOS type FET. Furthermore, in this case, it is possible to have a configuration in which a heating layer can be made to generate heat by making current flow in the heating layer in a state where the selection transistor is inactivated or the heating layer can generate heat and first information can be written in a nonvolatile memory cell by making the current flow in the heating layer in a state where the selection transistor is inactivated, and furthermore, it is possible to have a configuration in which second information is written in a desired nonvolatile memory cell by stopping heating a magnetization fixed layer and activating the selection transistor after the first information is written, and moreover, it is possible to have a configuration in which current is made to flow from the storage layer to the magnetization fixed layer in the nonvolatile memory cell at the time of writing the second information.

Furthermore, in the above-described various preferable configurations in the memory cell unit of the present disclosure, the memory cell unit provided in the electronic apparatus of the present disclosure, the nonvolatile memory cell of the present disclosure, and the information writing method of the present disclosure, it is possible to have a configuration in which the storage layer can be connected to one of source/drain regions, and in this case, the other one of the source/drain regions of the selection transistor is connected to a wiring layer (sense line).

Furthermore, in the above-described various preferable configurations of the memory cell unit of the present disclosure, the memory cell unit provided in the electronic apparatus of the present disclosure, the nonvolatile memory cell of the present disclosure, and the information writing method of the present disclosure, it is possible to have a configuration in which a gate electrode of the selection transistor can be connected to the word line, and in this case, it is possible to have a configuration in which the word line can extend in a second direction or the word line can extend in a direction different from one direction.

Furthermore, in the above-described various preferable configurations of the memory cell unit of the present disclosure, the memory cell unit provided in the electronic apparatus of the present disclosure, the nonvolatile memory cell of the present disclosure, and the information writing method of the present disclosure, it is possible to have a configuration in which a layered structure body of each nonvolatile memory cell is provided above the selection transistor via an interlayer insulation layer. Additionally, in the layered structure body of each nonvolatile memory cell, it is possible to have a form in which a magnetization fixed layer is provided on an underlayer formed on the interlayer insulation layer, and the magnetization fixed layer is formed above the interlayer insulation layer.

Furthermore, in the memory cell unit of the present disclosure, the memory cell unit provided in the electronic apparatus of the present disclosure, the nonvolatile memory cell of the present disclosure, and the information writing method of the present disclosure, which include the above-described preferable forms and configurations, it is possible to have a form in which a nonvolatile memory cell is a spin transfer torque based magnetic random access memory of a perpendicular magnetization type, more specifically, the nonvolatile memory cell includes a magnetoresistive effect element of a perpendicular magnetization type that performs information writing and erasing by reversing magnetization of a storage layer by spin torque.

In the nonvolatile memory cell of the present disclosure including the above-described various preferable forms, the nonvolatile memory cell constituting the memory cell unit of the present disclosure including the above-described various preferable forms, the nonvolatile memory cell in the information writing method of the present disclosure including the above-described various preferable forms, the nonvolatile memory cells provided in the electronic apparatus of the present disclosure including the above-described various preferable forms (hereinafter collectively referred to as "nonvolatile memory cell and the like of the present disclosure"), it is possible to have a structure in which a layered structure body having a tunnel magnetoresistance (TMR) effect or a giant magnetoresistance (GMR) effect includes a storage layer that stores information (also referred to as a storage layer, a magnetization reversal layer, or a free layer), the intermediate layer, and the magnetization fixed layer as described above.

Figure 15A:
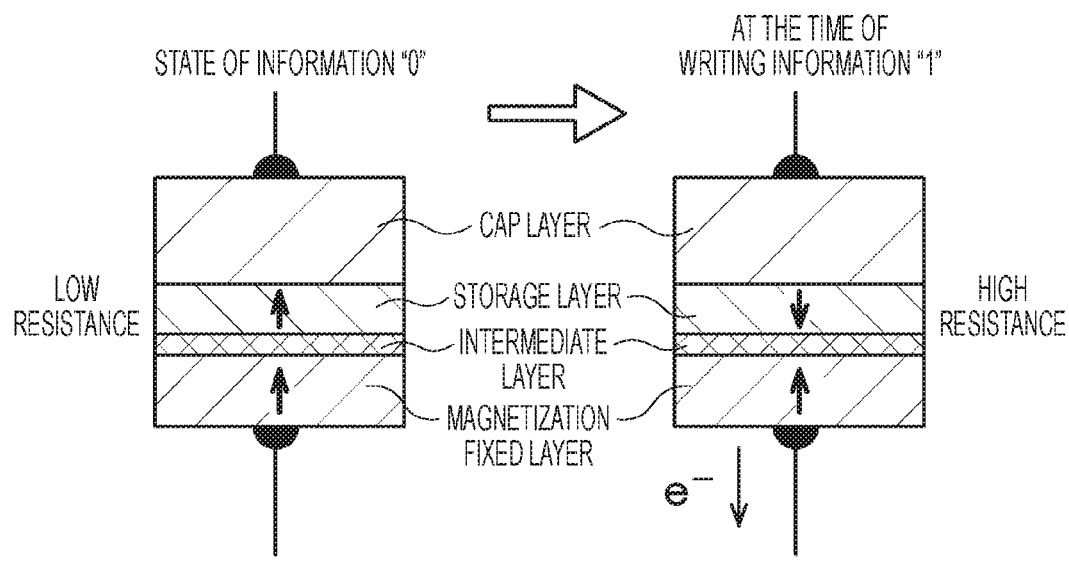
FIGS. 15A and 15B are respectively conceptual diagrams of a spin transfer torque based magnetic random access memory to which spin injection magnetization reversal is applied.
Figure 16A:
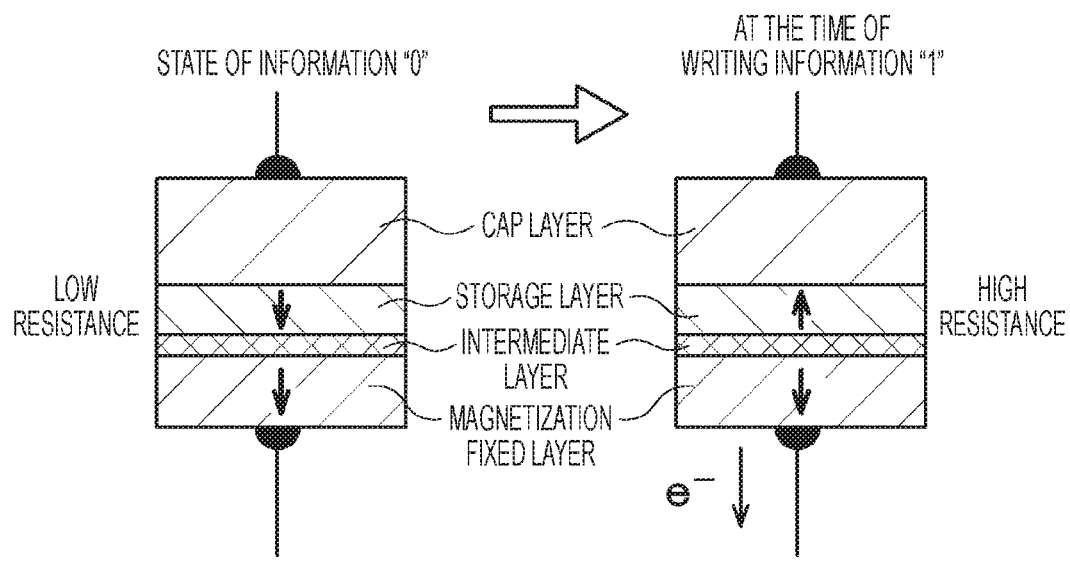
FIGS. 16A and 16B are respectively conceptual diagrams of the spin transfer torque based magnetic random access memory to which spin injection magnetization reversal is applied.

Assume that information "0" stored in the storage layer is rewritten as "1" as illustrated in conceptual diagrams in FIGS. 15A and 16A. More specifically, write current (also referred to as magnetization reversal current) is made to flow from the magnetization fixed layer to the storage layer in a parallel magnetization state. In other words, electrons are made to flow from the storage layer toward the magnetization fixed layer. Electrons having reached the magnetization fixed layer and having spin in one direction pass through the magnetization fixed layer. On the other hand, electrons having a spin in the other direction are reflected at the magnetization fixed layer. Then, when the electrons enter the storage layer, torque is applied to the storage layer, and the storage layer is reversed to an antiparallel state. Here, since the magnetization direction of the magnetization fixed layer is fixed, the magnetization direction cannot be reversed, and it may be considered that the storage layer is reversed in order to save an angular momentum in an entire system.

Figure 15B:
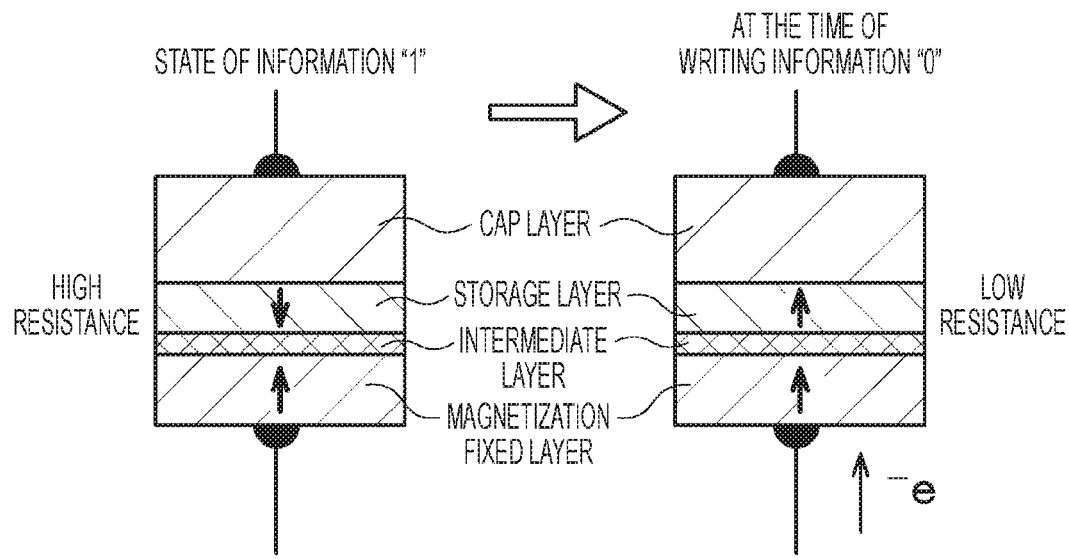
Figure 16B:
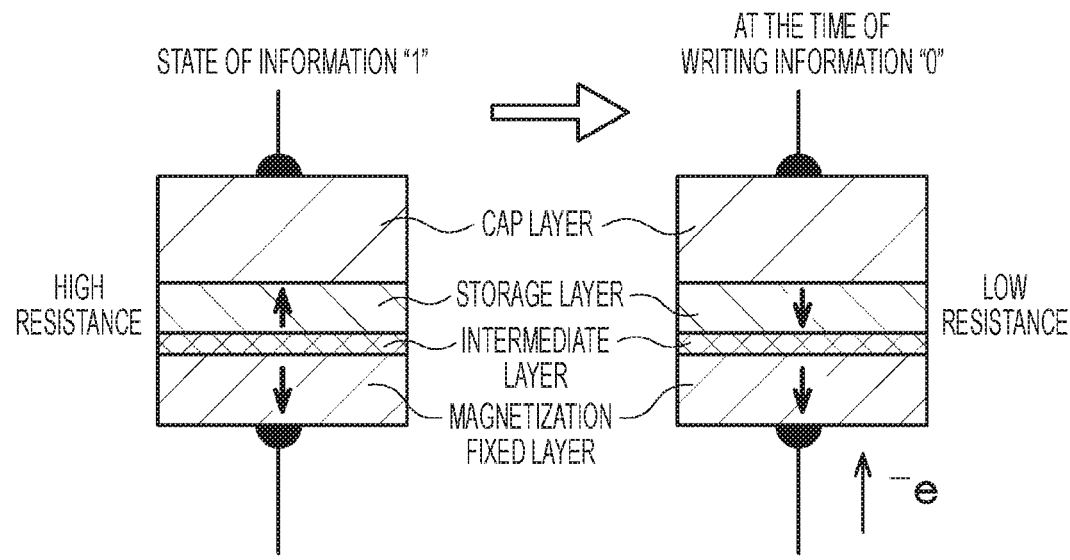

Assume that the information "1" stored in the storage layer is rewritten as "0" as illustrated in conceptual diagrams in FIGS. 15B and 16B. More specifically, write current is made to flow from the storage layer to the magnetization fixed layer in the antiparallel magnetization state. In other words, electrons are made to flow from the magnetization fixed layer toward the storage layer. The electrons having passed through the magnetization fixed layer have spin polarization, more specifically, a difference is generated between the number of upward electrons and the number of downward electrons. When the intermediate layer has a thickness sufficiently thin and the electrons reach the storage layer before this spin polarization is relaxed and the state becomes a non-polarized state (state in which the upward electrons and the downward electrons are the same in the number) in a normal nonmagnetic body, signs of a spin polarization level are reversed, thereby reversing, more specifically, changing orientations of spin angular momenta in order to decrease energy in the entire system. At this point, since all of the angular momenta in the system are needed to be saved, counteraction equivalent to the sum of changes of angular momenta caused by the electrons that have the orientations changed are applied to magnetic moment in the storage layer. Since the total number of electrons having the orientations changed is also few in a case where the current, more specifically, the number of electrons passing through the magnetization fixed layer in a unit time is few, the change in the angular momenta generated in the magnetic moment in the storage layer is also small, but when the current is increased, a large amount of changes in the angular momenta can be applied to the storage layer within a unit time. A temporal change in the angular momentum is torque, and when the torque exceeds a certain threshold, the magnetic moment of the storage layer starts to be reverted, and is stabilized after rotation of 180 degrees due to uniaxial anisotropy. More specifically, reversal from the antiparallel state to the parallel state occurs, and the information "0" is stored in the storage layer.

Figure 17:
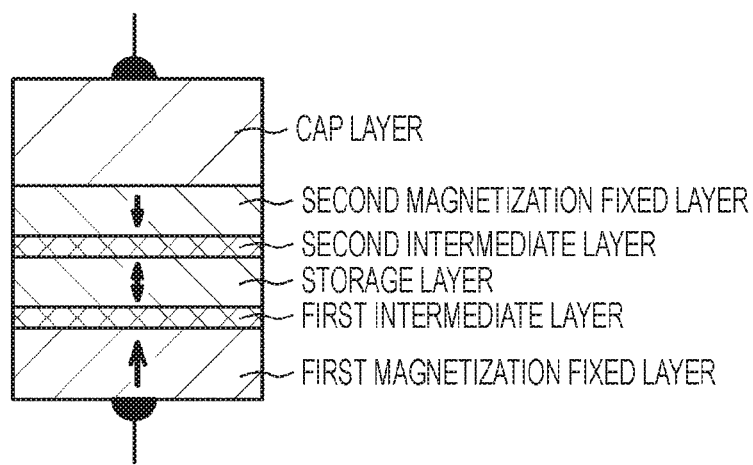
FIG. 17 is a conceptual diagram of a spin transfer torque based magnetic random access memory having a double spin filter structure.

Alternatively, as illustrated in the conceptual diagram of FIG. 17, it is possible to have a structure in which a layered structure body having a TMR effect or a GMR effect includes a magnetization fixed layer, an intermediate layer, a storage layer, an intermediate layer, and a magnetization fixed layer (double spin filter structure). With this structure, it is necessary to make a difference in a change in magnetoresistance between the two intermediate layers positioned above and below the storage layer. The wording "the layered structure body having the TMR effect includes the magnetization fixed layer, the intermediate layer, and the storage layer" indicates a structure in which the intermediate layer including a nonmagnetic material functioning as a tunnel insulation layer is interposed between the magnetization fixed layer including a magnetic material and the storage layer including a magnetic material. The intermediate layer takes a role of: cutting a magnetic coupling between the storage layer and the magnetization fixed layer; and making tunnel current flow.

It is possible to have a form in which the storage layer includes a metal material (alloy, compound) including cobalt, iron, and nickel, or a metal material (alloy, compound) including cobalt, iron, nickel, and boron. Alternatively, examples of a material constituting the storage layer can include: ferromagnetic materials such as nickel (Ni), iron (Fe), and cobalt (Co), alloys of these ferromagnetic materials (for example, Co—Fe, Co—Fe—B, Co—Fe—Ni, Fe—Pt, Ni—Fe, Fe—B, Co—B, and the like), or alloys obtained by adding gadolinium (Gd) to these alloys, alloys (for example, Co—Fe—B and the like) obtained by mixing these alloys with a non-magnetic element (for example, tantalum, boron, chromium, platinum, silicon, carbon, nitride, etc.), oxides each containing one or more kinds out of Co, Fe, and Ni (for example, ferrite: Fe—MnO, and the like), a group of intermetallic compounds called half-metallic ferromagnetic materials (Heusler alloys: NiMnSb, Co$_2$MnGe, Co$_2$MnSi, Co$_2$CrAl, and the like), and oxides (for example, (La, Sr)MnO$_3$, CrO$_2$, Fe$_3$O$_4$, and the like). Furthermore, in the perpendicular magnetization type, a heavy rare earth element such as terbium (Tb), dysprosium (Dy), or holmium (Ho) may be added to such an alloy in order to further increase perpendicular magnetic anisotropy. Crystallinity of the storage layer and that of magnetization fixed layer are substantially arbitrary, and may be polycrystalline, single crystal, or amorphous. Additionally, the storage layer can have a single-layer structure or a layered structure in which the above-described plurality of different ferromagnetic material layers is layered, or can be a layered structure in which a ferromagnetic material layer and a nonmagnetic material layer are layered. Furthermore, a nonmagnetic element can also be added to a material constituting the storage layer. By adding the nonmagnetic element, obtained are effects of, for example, improvement of heat resistance by preventing diffusion, increase in the magnetoresistance effect, increase in dielectric voltage accompanied by planarization, and the like. Examples of the nonmagnetic element can include B, C, N, O, F, Li, Mg, Si, P, Ti, V, Cr, Mn, Ni, Cu, Ge, Nb, Ru, Rh, Pd, Ag, Ta, Ir, Pt, Au, Zr, Hf, W, Mo, Re, and Os.

Additionally, ferromagnetic material layers having different compositions can also be layered as a storage layer. Alternatively, a ferromagnetic material layer and a soft magnetic material layer can be layered or a plurality of ferromagnetic material layers can also be layered via a soft magnetic material layer or a nonmagnetic body layer. Particularly, in a case of having a structure in which a plurality of ferromagnetic material layers such as an Fe layer, a Co layer, an Fe—Ni alloy layer, a Co—Fe alloy layer, a Co—Fe—B alloy layer, a Fe—B alloy layer, and a Co—B alloy layer is layered via the nonmagnetic body layer, a mutual relation of magnetic strength between the ferromagnetic material layers can be adjusted, and therefore, magnetization reversal current can be suppressed from being increased in a spin transfer torque based magnetic random access memory. Examples of a material of the nonmagnetic body layer can include Ru, Os, Re, Ir, Au, Ag, Cu, Al, Bi, Si, B, C, Cr, Ta, Pd, Pt, Zr, Hf, W, Mo, Nb, V, or an alloy thereof.

As a material constituting the entire magnetization fixed layer, it is possible to exemplify a material (ferromagnetic material) constituting the above-described storage layer, or the magnetization fixed layer can include a layered body of a Co layer and a Pt layer, a layered body of a Co layer and a Pd layer, a layered body of a Co layer and a Ni layer, a layered body of a Co layer and a Tb layer, a Co—Pt alloy layer, a Co—Pd alloy layer, a Co—Ni alloy layer, Co—Ni—Fe alloy layer, a Co—Fe alloy layer, a Co—Fe—B alloy layer, a Ni—Fe alloy layer, a Co—Tb alloy layer, a Co layer, a Fe layer, a Ni layer, or a Co—Fe—B alloy layer, and alternatively, a magnetic property may be adjusted and various physical properties such as crystal structure, crystallinity, and stability of a substance may be adjusted by adding, to these materials, a nonmagnetic element such as Ag, Cu, Au, Al, Si, Bi, Ta, B, C, O, N, Pd, Pt, Zr, Ta, Hf, Ir, W, Mo, Nb, V, Ru, or Rh. Since the magnetization direction of the magnetization fixed layer is a reference of information, a magnetization direction thereof should not be changed by storing (recording) or reading information, however; the magnetization direction is not necessarily fixed to a certain direction and the magnetization fixed layer is at least required to have a configuration and a structure in which the magnetization direction is more hardly changed than in the storage layer by more increasing coercive force thereof, more increasing a thickness thereof, or more increasing a magnetic damping constant thereof than that of the storage layer.

The magnetization fixed layer includes at least two fixed layers, and such a structure is called a layered ferri-structure. The layered ferri-structure is a layered structure having antiferromagnetic coupling, more specifically, a structure in which interlayer exchange coupling between the two magnetic material layers (first fixed layer and second fixed layer) becomes antiferromagnetic, and is also called synthetic antiferromagnet (SAF), and further represents a structure in which the interlayer exchange coupling between the two magnetic material layers becomes antiferromagnetic or ferromagnetic in accordance with a thickness of a nonmagnetic layer, and the layered ferri-structure is reported by, for example, S. S. Parkin et al., on pp 2304-2307 in Physical Review Letters dated 7 May (1990).

The first fixed layer (reference layer) constituting the layered ferri-structure can have a form containing at least one kind of element selected from a group including iron (Fe), cobalt (Co), and nickel (Ni), or contains boron (B) and at least one kind of element selected from a group including iron Fe), cobalt (Co), and nickel (Ni), and the second fixed layer can have a form mainly including at least one kind of element (for convenience, referred to as "element-A") selected from a group including iron (Fe), cobalt (Co), and nickel (Ni), manganese (Mn) and at least one kind of element (note that element different from the element-A) selected from a group including platinum (Pt), palladium (Pd), nickel (Ni), manganese (Mn), iridium (Ir), and rhodium (Rh).

Here, coercive force of the material constituting the first fixed layer differs from coercive force of the material constituting the second fixed layer at the time of heating the magnetization fixed layer, and exemplary combinations (of a material constituting a fixed layer having low coercivity and a material constituting a fixed layer having high coercive force) can include (CoFe, CoPt), (CoFeB, CoPt), (CoFe, CoPd), and (CoFeB, CoPd), but not limited thereto.

Examples of a material constituting the nonmagnetic layer can include ruthenium (Ru), an alloy thereof, and a ruthenium compound, or can include Os, Re, Ir, Au, Ag, Cu, Al, Bi, Si, B, C, Cr, Ta, Pd, Pt, Zr, Hf, W, Mo, Nb, V, Rh, and alloys thereof.

The intermediate layer preferably includes a nonmagnetic material. More specifically, in the spin transfer torque based magnetic random access memory, the intermediate layer in a case of constituting the layered structure body having the TMR effect preferably includes a material that is an insulation material and also is a nonmagnetic material. Here, examples of the material that is an insulation material and also is a nonmagnetic material can include various insulation materials such as a magnesium oxide (MgO), a magnesium nitride, magnesium fluoride, an aluminum oxide (AlO$_x$), an aluminum nitride (AlN), a silicon oxide (SiO$_x$), a silicon nitride (SiN), TiO$_2$, Cr$_2$O$_3$, Ge, NiO, CdO$_x$, HfO$_2$, Ta$_2$O$_5$, Bi$_2$O$_3$, CaF, SrTiO$_3$, AlLaO$_3$, Mg—Al$_2$—O, Al—N—O, BN, and ZnS, a dielectric material, and a semiconductor material. It is preferable that an area resistance value of the intermediate layer including the insulation material be about several tens $\Omega \cdot \mu m^2$ or less. In a case where the intermediate layer includes a magnesium oxide (MgO), it is preferable that a MgO layer be crystallized, and it is more preferable that the MgO layer have crystal orientation in a (001) direction. Additionally, in the case where the intermediate layer includes the magnesium oxide (MgO), it is preferable that a thickness thereof be 1.5 nm or less. On the other hand, examples of a material constituting the layered structure body having the GMR effect can include a conductive material such as Cu, Ru, Cr, Au, Ag, Pt, Ta or an alloy thereof, and when conductivity is high (resistivity is several hundred $\mu\Omega \cdot cm$ or less), an arbitrary nonmetallic material may be used, but it is preferable to suitably select a material that hardly causes interfacial reaction with the storage layer or the magnetization fixed layer.

The storage layer can have a thickness of, for example, 0.5 nm to 30 nm, and the magnetization fixed layer can have a thickness of, for example, 0.5 nm to 30 nm.

The intermediate layer including the material that is the insulation material and also is the nonmagnetic material can be obtained by oxidizing or nitriding a metal layer formed by a sputtering method, for example. More specifically, in a case of using an aluminum oxide ($AlO_x$) or a magnesium oxide (MgO) as the insulation material constituting the intermediate layer, it is possible to exemplify: a method of oxidizing, in the air, aluminum or magnesium formed by the sputtering method; a method of oxidizing, with plasma, aluminum or magnesium formed by the sputtering method; a method of oxidizing, with IPC plasma, aluminum or magnesium formed by the sputtering method; a method of naturally oxidizing, in oxygen, aluminum or magnesium formed by the sputtering method; a method of oxidizing, with oxygen radials, aluminum or magnesium formed by the sputtering method; a method of emitting ultraviolet rays at the time of naturally oxidizing, in oxygen, aluminum or magnesium formed by the sputtering method; a method of depositing aluminum or magnesium by a reactive sputtering method; and a method of depositing an aluminum oxide ($AlO_x$) or a magnesium oxide (MgO) by the sputtering method.

The various layers described above can be formed by a physical phase deposition (PVD) method exemplified by the sputtering method, an ion beam deposition method, or a vacuum deposition method, and a chemical vaper deposition (CVD) method represented by an atomic layer deposition (ALD) method. Additionally, patterning of these layers can be performed by a reactive ion etching method (RIE method) or an ion milling method (ion beam etching method). It is preferable that the various layers be consecutively formed inside a vacuum device, and it is preferable to perform patterning thereafter.

It is preferable that a cap layer be formed on a surface of the storage layer located on an opposite side of a surface provided with the magnetization fixed layer in order to: prevent mutual diffusion of atoms constituting a connection portion and the like and atoms constituting the storage layer; reduce contact resistance; and prevent oxidation of the storage layer. The cap layer can have a form that includes: a single layer structure including at least one kind of material selected from a group including hafnium, tantalum, tungsten, zirconium, niobium, molybdenum, titanium, vanadium, chromium, magnesium, ruthenium, rhodium, palladium, and platinum; a single layer structure including an oxide such as a magnesium oxide layer, an aluminum oxide layer, a titanium oxide layer, a silicon oxide layer, a $Bi_2O_3$ layer, a $SrTiO_3$ layer, an $AlLaO_3$ layer, an Al—N—O layer, a Mg—Ti—O layer, or a $MgAl_2O_4$ layer; or a layered structure (e.g., Ru layer/Ta layer) including at least one kind of a material layer selected from a group including hafnium, tantalum, tungsten, zirconium, niobium, molybdenum, titanium, vanadium, chromium, magnesium, ruthenium, rhodium, palladium, and platinum and at least one kind of an oxide layer selected from a group including MgTiO, MgO, AlO, and SiO.

In the spin transfer torque based magnetic random access memory of the perpendicular magnetization type, it is preferable that the storage layer have a three-dimensional shape that is a columnar shape (cylindrical shape) in the viewpoint of ensuring easiness of processing and uniformity of directions of easy-magnetization axes in the storage layer, but the three-dimensional shape is not limited thereto and can be a triangular prism, a quadrangular prism, a hexagonal prism, an octagonal prism, and the like (including those having rounded side edges or rounded lateral edges), or an elliptic cylinder. Preferably, the storage layer has the area of 0.01 $\mu m^2$ or less, for example, in the viewpoint of easily reversing an orientation of magnetization with low magnetization reversal current.

Additionally, an underlayer including Ta, Cr, Ru, Ti, or the like may be formed as described above in order to improve crystallinity of the magnetic layer.

In the nonvolatile memory cell and the like of the present disclosure, an insulation material layer is formed on the interlayer insulation layer so as to bury the layered structure body or the storage layer of the nonvolatile memory cell.

Exemplary vertical arrangement relation between the storage layer, the magnetization fixed layer, and the selection transistor can be: the selection transistor, the magnetization fixed layer, and the storage layer are layered sequentially from the lowed side; or the selection transistor, the storage layer, and the magnetization fixed layer are layered sequentially from the lowed side. In the former case, one of the source/drain region of the selection transistor and the storage layer may be connected via a connection hole (or a connection hole and a landing pad portion or lower layer wiring) provided in the interlayer insulation layer, and via a connection hole and a connection portion provided in the insulation material layer. Additionally, in the latter case, one of the source/drain regions of the selection transistor and the storage layer may be connected via a connection hole (or a connection hole and a landing pad portion or lower layer wiring) provided in the interlayer insulation layer.

Examples of a material constituting the interlayer insulation layer or the insulation material layer can include a silicon oxide ($SiO_2$), a silicon nitride (SiN), SiON, SOG, NSG, BPSG, PSG, BSG, LTO, and $Al_2O_3$. The connection hole, the connection portion, and the wiring layer can include polysilicon doped with impurities, a high melting point metal such as tungsten, Ti, Pt, Pd, Cu, TiW, TiNW, $WSi_2$, or $MoSi_2$, or a metal silicide, and can be formed on the basis of the CVD method or the PVD method exemplified by the sputtering method.

Examples of electronic apparatuses (electronic devices) of the present disclosure can include: electronic devices such as a mobile device, a game machine, a musical device, and a video device; and a fixed type electronic device. Also, a storage device including a memory cell unit in which the nonvolatile memory cells of the present disclosure are arrayed in a two-dimensional matrix can be exemplified.

Embodiment 1

Figure 1B:
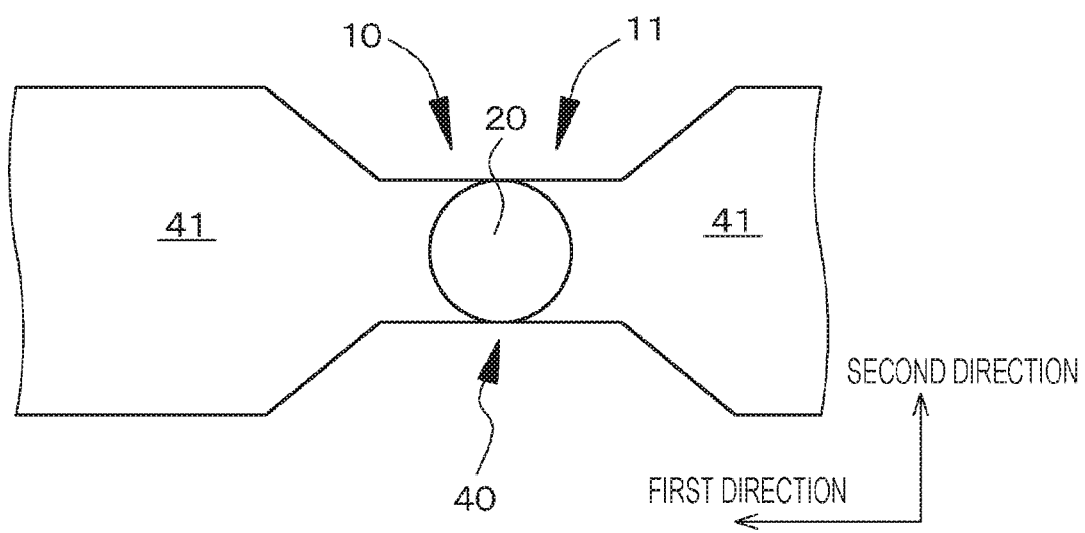
Figure 2:
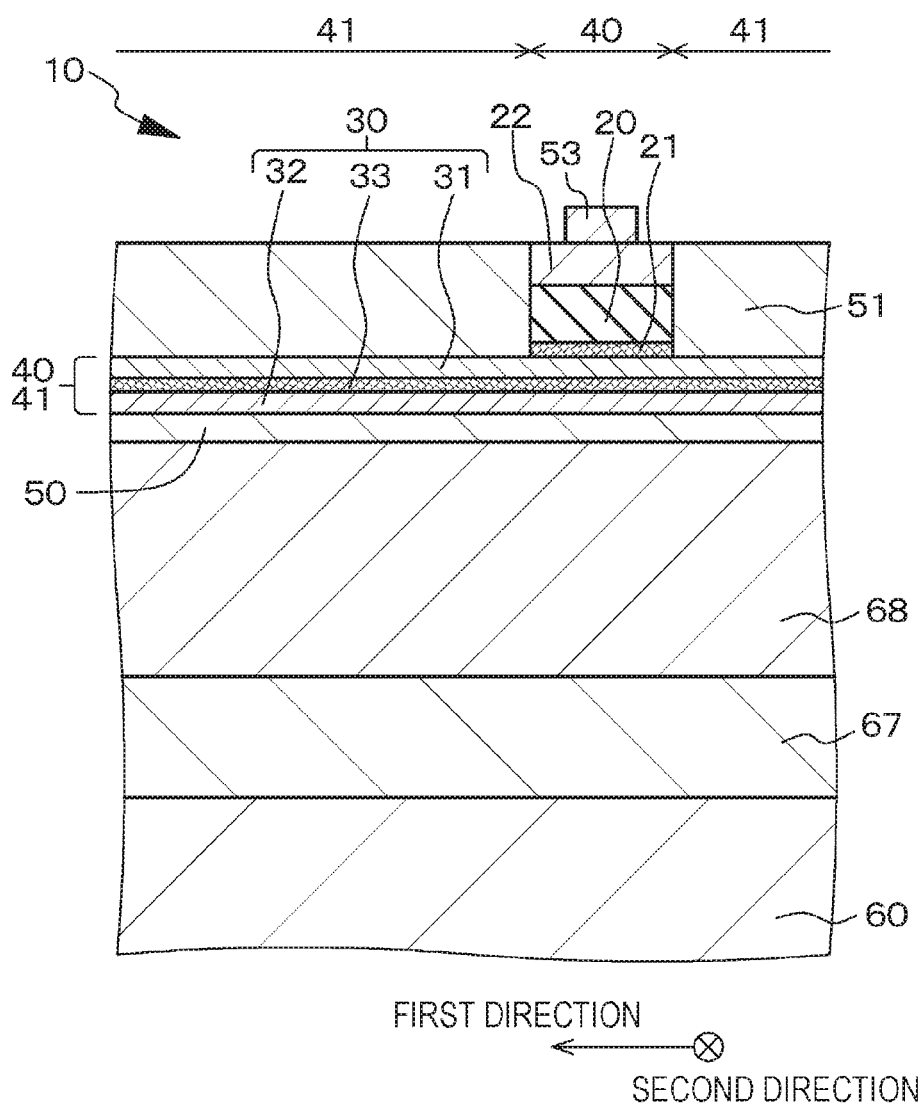
FIG. 2 is a schematic partial cross-sectional view of the nonvolatile memory cell of Embodiment 1 taken along a first direction illustrated in FIG. 1A.
Figure 3:
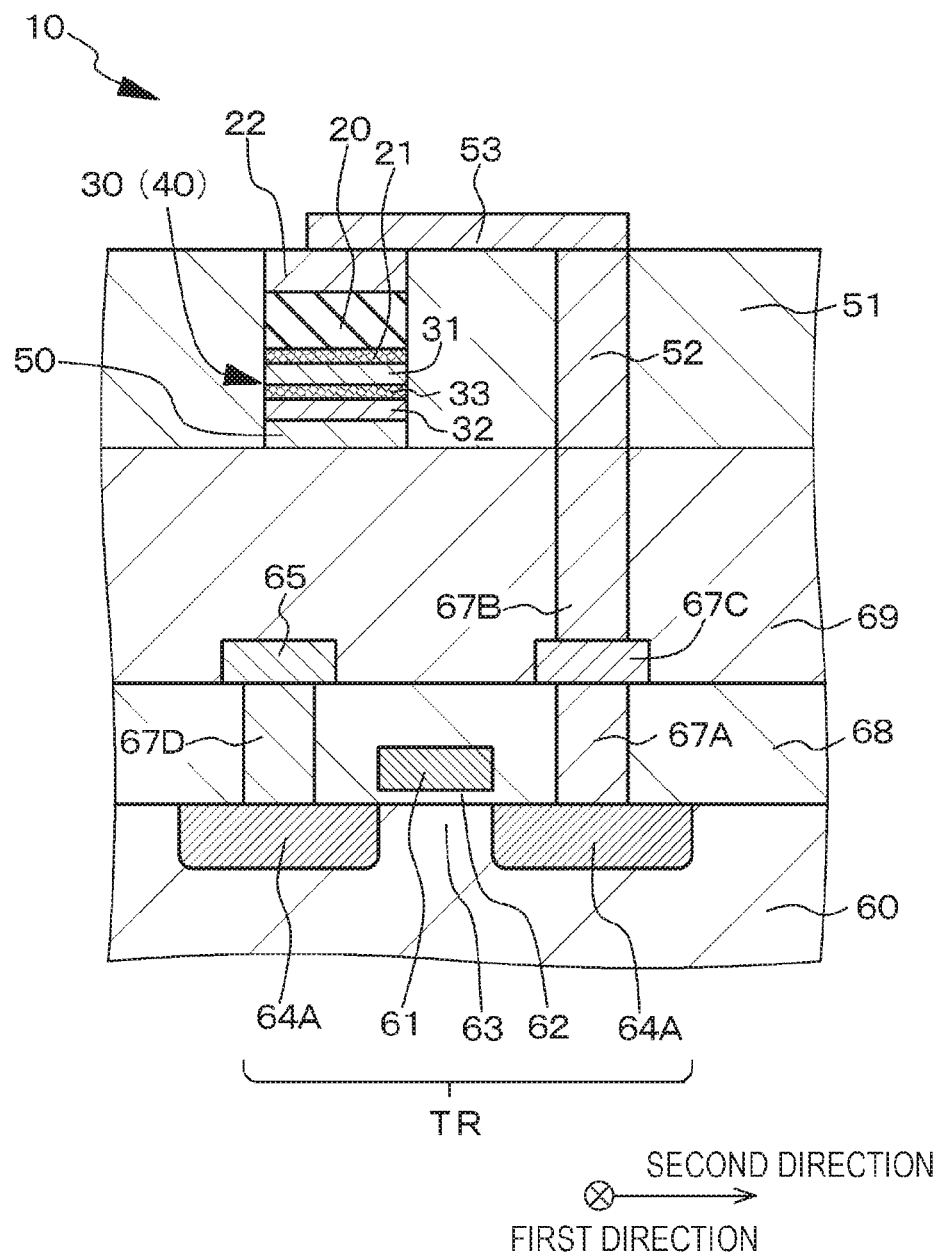
FIG. 3 is a schematic partial cross-sectional view of the nonvolatile memory cell of Embodiment 1 along a second direction illustrated in FIG. 1A.
Figure 4:
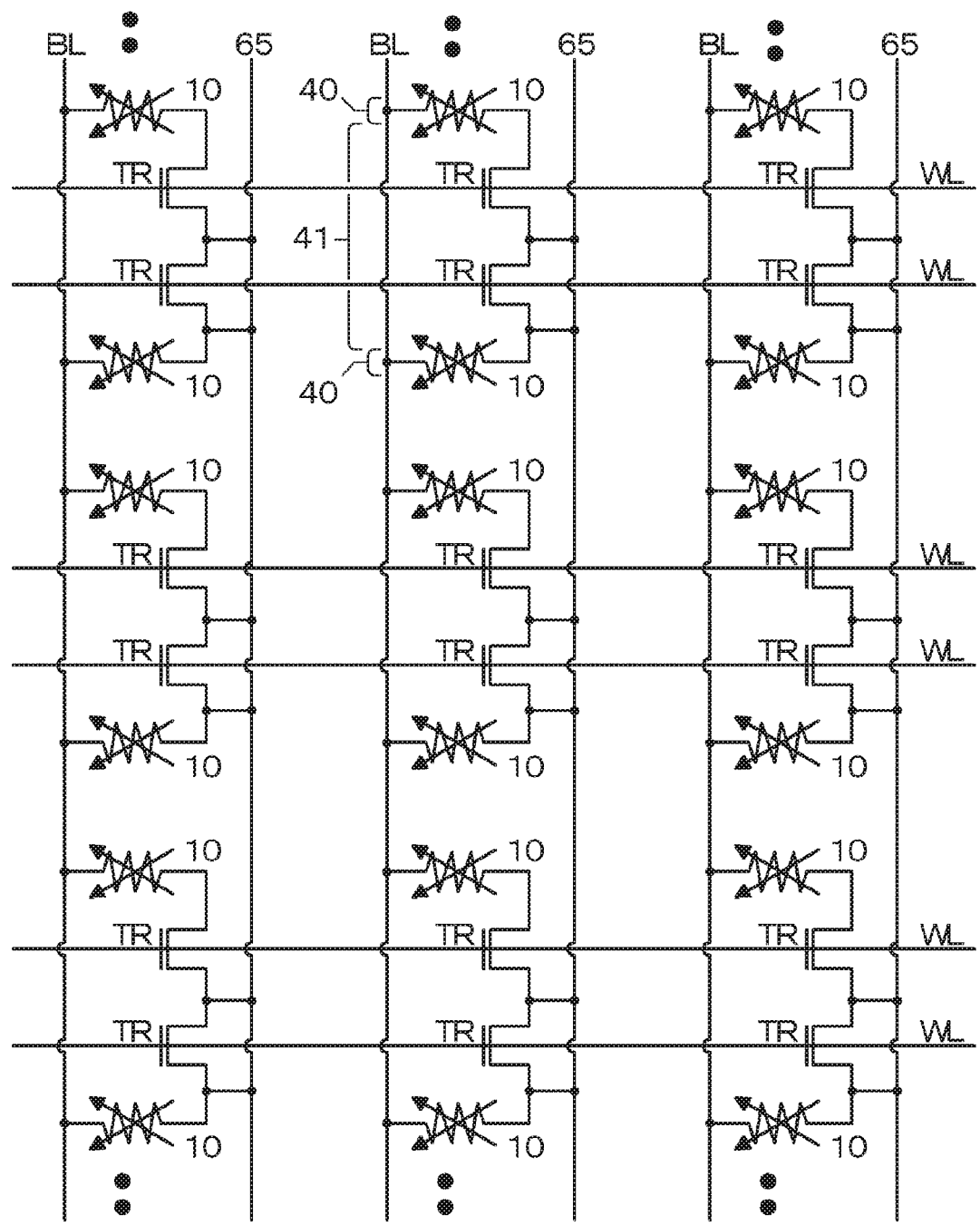
FIG. 4 is an equivalent circuit diagram of a nonvolatile memory cell including a spin transfer torque based magnetic random access memory and a selection transistor.
Figure 5:
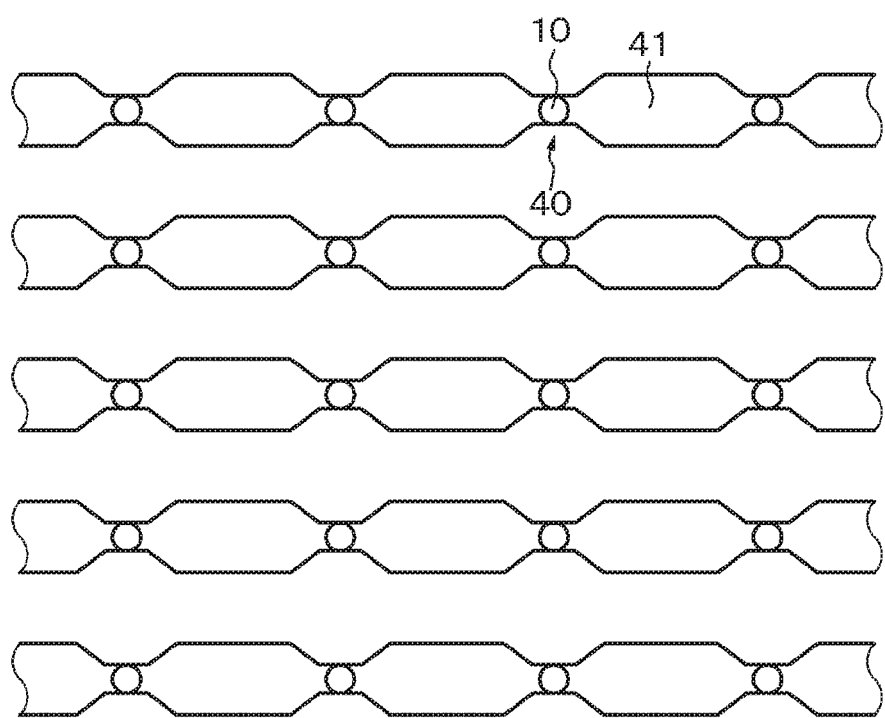
FIG. 5 is a diagram schematically illustrating an arrangement state of layered structure bodies and heating layers in a part of a memory cell unit.
Figure 6A:
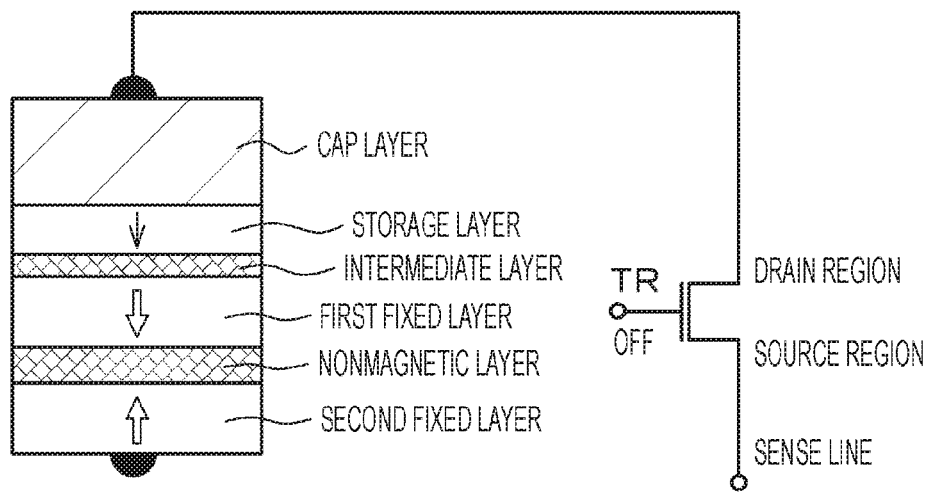
FIGS. 6A and 6B are diagrams schematically illustrating operation states of the nonvolatile memory cell of Embodiment 1.
Figure 6B:
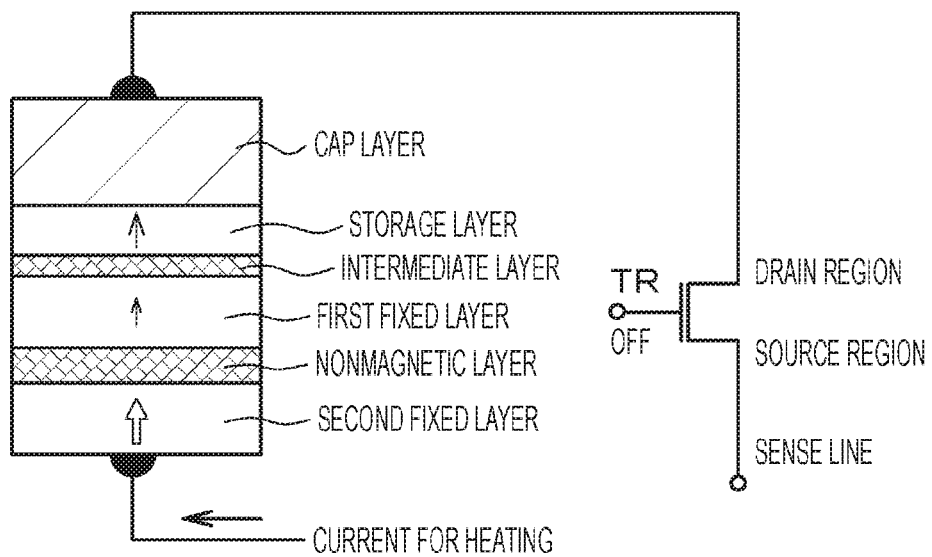

Embodiment 1 relates to a nonvolatile memory cell of the present disclosure, a memory cell unit of the present disclosure, an information writing method of the present disclosure, and an electronic apparatus of the present disclosure. FIG. 1A is a schematic perspective view of the nonvolatile memory cell of Embodiment 1 (excluding some constituent elements), FIG. 1B schematically illustrates an arrangement state of a layered structure body and a heating layer, FIG. 2 is a schematic partial cross-sectional view of the nonvolatile memory cell of Embodiment 1 taken along a first direction illustrated in FIG. 1A, FIG. 3 is a schematic partial cross-sectional view of the nonvolatile memory cell of Embodiment 1 taken along a second direction illustrated in FIG. 1A, FIG. 4 illustrates an equivalent circuit diagram of a part of the memory cell unit of Embodiment 1, and FIG. 5 schematically illustrates an arrangement state of the layered structure bodies and the heating layers in a part of the memory cell unit. Additionally, FIGS. 6A, 6B, 7A, and 7B schematically illustrate operation states of the nonvolatile memory cell of Embodiment 1.

A nonvolatile memory cell 10 of Embodiment 1 includes a layered structure body 11 and a heating layer 40. Additionally, the layered structure body 11 is formed by layering: a storage layer 20 that stores information in accordance with a magnetization direction; and a magnetization fixed layer 30 that defines the magnetization direction of the storage layer 20. Furthermore, the heating layer 40 heats the magnetization fixed layer 30 to control the magnetization direction of the magnetization fixed layer 30.

Additionally, the memory cell unit of Embodiment 1 is formed by arraying a plurality of nonvolatile memory cells 10 in a two-dimensional matrix in the first direction and the second direction different from the first direction, and each of the nonvolatile memory cells 10 includes a layered structure body 11 and a heating layer 40. Additionally, the layered structure body 11 is formed by layering: a storage layer 20 that stores information in accordance with a magnetization direction; and a magnetization fixed layer 30 that defines the magnetization direction of the storage layer 20. Furthermore, the heating layer 40 heats the magnetization fixed layer 30 to control the magnetization direction of the magnetization fixed layer 30.

Additionally, an electronic apparatus of Embodiment 1 includes the memory cell unit of Embodiment 1.

Here, the heating layer 40 includes at least a part of a magnetization fixed layer 30 (specifically including the magnetization fixed layer 30 in Embodiment 1), heating layers 40 constituting respective nonvolatile memory cell 10 are connected by heating layer extended portions 41 respectively in a group of the nonvolatile memory cells arrayed along the first direction, and the heating layer extended portion 41 has a layer structure same as that of the heating layer 40.

Alternatively, the heating layer 40 includes at least a part of each magnetization fixed layer 30 (specifically, including a magnetization fixed layer 30 in Embodiment 1), heating layers 40 constituting respective nonvolatile memory cell 10 are connected respectively by heating layer extended portions 41 between the nonvolatile memory cells adjacent along one direction, and the heating layer extended portion 41 has a layer structure same as that of the heating layer 40.

Additionally, the heating layer 40 has a maximum width narrower than an average width of the heating layer extended portions 41, and consequently, when current is made to flow in the heating layer 40 and the heating layer extended portion 41, the heating layer 40 generates heat and can surely heat the magnetization fixed layer 30. Furthermore, the heating layer 40 and heating layer extended portion 41 also serve as a bit line BL.

Furthermore, an intermediate layer 21 is provided between the magnetization fixed layer 30 and the storage layer 20, the magnetization fixed layer 30 has a layered structure including a first fixed layer 31, a nonmagnetic layer 33, and a second fixed layer 32 from the intermediate layer side, the first fixed layer 31 and the second fixed layer 32 have antiferromagnetic coupling, and coercive force (coercivity) of the first fixed layer 31 differs from the coercive force (coercivity) of the second fixed layer 32 at the time of heating the magnetization fixed layer 30. In Embodiment 1, specifically, the coercive force (coercivity) of the second fixed layer 32 is higher than the coercive force (coercivity) of the first fixed layer 31. Additionally, the antiferromagnetic coupling between the first fixed layer 31 and the second fixed layer 32 is uncoupled by heating the magnetization fixed layer 30, and a magnetization direction of the first fixed layer 31, a magnetization direction of the second fixed layer 32, and a magnetization direction of the storage layer 20 become the same direction (same orientation). Furthermore, a magnetization direction of a fixed layer having larger coercive force (coercivity) out of the first fixed layer 31 and the second fixed layer 32 (second fixed layer 32 in Embodiment 1) becomes the same direction (same orientation) as the magnetization direction of the storage layer 20.

Additionally, each nonvolatile memory cell 10 further includes a selection transistor TR including a field effect transistor. Then, the heating layer 40 generates heat by making current flow in the heating layer 40 in a state that the selection transistor TR is inactivated.

The storage layer 20 is connected to one 64A of source/drain regions, and the other one 64B of the source/drain regions is connected to a wiring layer (sense line) 65.

A gate electrode 61 of the selection transistor TR is connected to a word line WL (functioning also as an address line). Specifically, the word line WL includes the gate electrode 61 and an extended portion of the gate electrode 61 of the selection transistor TR. Additionally, the word line WL extends in the second direction, or the word line WL extends in a direction different from the one direction. In Embodiment 1, the selection transistor TR is formed a PMOS transistor, but can also include an NMOS transistor.

A layered structure body 11 of each nonvolatile memory cell 10 is provided above the selection transistor (field effect transistor) TR via interlayer insulation layers 68 and 69 including $SiO_2$. Specifically, in Embodiment 1, the magnetization fixed layer 30 is provided on an underlayer 50 formed on the interlayer insulation layer 69 in the layered structure body 11 of each nonvolatile memory cell 10. In other words, as a vertical arrangement relation between the storage layer 20, the magnetization fixed layer 30, and the selection transistor TR, the selection transistor TR, magnetization fixed layer 30, and storage layer 20 are layered sequentially from the lower side. The selection transistor TR includes a gate electrode 61, a gate insulation layer 62, a channel formation region 63, and source/drain regions (one 64A of the source/drain regions and the other one 64B of the source/drain regions). An insulation material layer 51 including $SiO_2$ is formed on the interlayer insulation layer 69 so as to bury the storage layer 20. Additionally, the one 64A of the source/drain regions of the selection transistor TR and the storage layer 20 are connected via: connection holes 67A and 67B including tungsten provided in the interlayer insulation layers 68 and 69; a landing pad portion 67C; a connection hole 52 provided in the insulation material layer 51; and a connection portion 53 provided on the insulation material layer 51.

In the nonvolatile memory cell 10 of Embodiment 1, a magnetization direction of each storage layer 20 is changed in accordance with information to be stored. Additionally, an easy-magnetization axis is parallel to a layered direction of the fixed layer 30 (i.e., perpendicular magnetization type) in the storage layer 20. More specifically, the nonvolatile memory cell 10 of Embodiment 1 is a spin transfer torque based magnetic random access memory of the perpendicular magnetization type (magnetoresistive effect element of the perpendicular magnetization type in which information writing and erasing is performed by reversing magnetization of a storage layer by spin torque, and also including an MTJ element.

The storage layer 20 includes a ferromagnetic material having magnetic moment in which a magnetization direction is freely changed in parallel to the layered direction of the magnetization fixed layer 30, more specifically, includes a Co—Fe—B alloy [$(Co_{20}Fe_{80})_{80}B_{20}$]. The intermediate layer 21 including a nonmagnetic material includes an insulation layer functioning as a tunnel barrier layer (tunnel insulation layer), specifically, a magnesium oxide (MgO) layer. Since the intermediate layer 21 includes the MgO layer, a magnetoresistive change ratio (MR ratio) can be increased, and consequently, efficiency of spin injection can be improved and magnetization reversal current density required to reverse the magnetization direction of the storage layer 20 can be reduced. The storage layer 20 has a three-dimensional shape of a cylindrical shape (columnar shape) or a quadrangular prism but not limited thereto. Furthermore, a cap layer 22 is formed on a surface of the storage layer 20 on an opposite side of the surface where the magnetization fixed layer 30 is provided. The cap layer 22 contacts the connection portion 53 provided on the insulation material layer 51.

As described above, each magnetization fixed layer 30 has a layered ferri-structure (also called a layered ferri-pinned structure) in which at least two magnetic material layers are layered. A nonmagnetic layer 33 including ruthenium (Ru) is formed between the first fixed layer (reference layer) 31 constituting the layered ferri-structure and the second fixed layer 32 constituting the layered ferri-structure. Furthermore, specifically, the first fixed layer 31 includes a layered structure of a Co layer, a Ta layer, and a CoFeB layer (layered structure of Co/Ta/CoFeB from the interlayer insulation layer side), and the second fixed layer 32 includes a layered structure in which a Co layer and a Pt layer are layered a plurality of times (for example, in the order of Co layer/Pt layer/Co layer/Pt layer/Co layer/Pt layer from the interlayer insulation layer side). A magnetization direction of the first fixed layer 31 (reference layer) or that of the second fixed layer 32 is a magnetization direction to be a reference of information to be stored in each storage layer 20, and information "0" and information "1" are defined by a relative angle between the magnetization direction of the storage layer 20 and the magnetization direction of the first fixed layer 31 or that of the second fixed layer 32.

The above-described various layered structures are described in Table 1 below.

<Table 1>
Cap layer 22: Layer in which Ta layer with thickness of 1 nm and Ru layer with thickness of 5 nm are layered
Storage layer 20: $(Co_{20}Fe_{80})_{80}B_{20}$ layer with thickness of 1.6 nm
Intermediate layer 21: MgO layer with thickness of 1.0 nm
Magnetization fixed layer 30
First fixed layer 31: CoFeB layer with thickness of 0.9 nm
Ta layer with thickness of 0.2 nm
Co layer with thickness of 0.8 nm
Nonmagnetic layer 33: Ru layer with thickness of 0.8 nm
Second fixed layer 32: Layered structure in which Pt layer with thickness of 0.1 nm and Co layer with thickness of 0.3 nm are repeatedly layered three times
Underlayer 50: Ta layer with film thickness of 5 nm An information writing method of Embodiment 1 is an information writing method in the memory cell unit in which the plurality of nonvolatile memory cells 10 is arrayed in a two-dimensional matrix in the first direction and the second direction different from the first direction, and each of the nonvolatile memory cells 10 includes a layered structure body 11 formed by layering a storage layer 20 that stores information in accordance with a magnetization direction and a magnetization fixed layer 30 that defines a magnetization direction of the storage layer 20. Additionally, information based on a magnetization direction of the magnetization fixed layer 30 is written in the storage layer 20 by controlling the magnetization direction of the magnetization fixed layer 30 by heating the magnetization fixed layer 30.

Furthermore, as described above, each of the nonvolatile memory cells 10 in the information writing method of Embodiment 1 includes a heating layer 40 including at least a part of a magnetization fixed layer 30 constituting each layered structure body 11, and heating layers 40 constituting respective nonvolatile memory cells 10 are connected by heating layer extended portions 41 respectively in a group of the nonvolatile memory cells arrayed along the first direction, the heating layer extended portion 41 includes a layer structure same as that of the heating layer 40, and the magnetization fixed layer 30 is heated by making current flow in the heating layer 40 and the heating layer extended portion 41. An exemplary value of the current made to flow in the heating layer 40 and the heating layer extended portion 41 can be 10 mega amperes/cm², and an exemplary period during which the current is made to flow can be 10 to 100 nanoseconds. Then, with this current flow, a temperature of the magnetization fixed layer 30 becomes about 250° C.

Here, in the information writing method of Embodiment 1, first information (information "1") is collectively written in the group of the nonvolatile memory cells arrayed along the first direction by heating the magnetization fixed layers 30. Specifically, the heating layer 40 is made to generate heat by making the current flow in the heating layer 40 in a state where the selection transistor (field effect transistor) TR is inactivated, and the first information written in the nonvolatile memory cells 10 by heating the magnetization fixed layers 30. More specifically, assume a case where the information "0" is stored in the storage layer 20 (refer to the conceptual diagram of FIG. 6A). Note that the things are similar in a case where the information "1" is stored in each storage layer 20. In the case where the information "0" is stored, an orientation of magnetic moment of the storage layer 20 including a ferromagnetic material and that of the first fixed layer (reference layer) 31 are parallel to each other, and the storage layer 20 is in a low resistance state. Additionally, in the case where the information "1" is stored, mutual orientations of the magnetic moment are antiparallel to each other, and the storage layer 20 is in the high resistance state. In this state, the heating layer 40 generates heat and heats the magnetization fixed layer 30 by making the current flow in the heating layer 40 and the heating layer extended portion 41. Consequently, the temperature of the magnetization fixed layer 30 is increased, and coercive force of the first fixed layer (reference layer) 31 and that of the second fixed layer 32 are more decreased than those before heating. Additionally, a decrease rate is different between the first fixed layer 31 and the second fixed layer 32. Thus, antiferromagnetic coupling between the first fixed layer 31 and the second fixed layer 32 is uncoupled, and the magnetization direction of the first fixed layer 31, the magnetization direction of the second fixed layer 32, and the magnetization direction of the storage layer 20 can be made to the same direction (same orientation). In Embodiment 1, the second fixed layer 32 has the coercive force larger than that of the first fixed layer 31. Therefore, the magnetization direction of the second fixed layer 32 and the magnetization direction of the storage layer 20 become the same direction (same orientation) (refer to the conceptual diagram of FIG. 6B). When the current flowing in the heating layer 40 and the heating layer extended portion 41 is stopped, antiferromagnetic coupling between the first fixed layer 31 and the second fixed layer 32 is restored (refer to the conceptual diagram of FIG. 7A). More specifically, the magnetization direction of the second fixed layer 32 remains unchanged, but the magnetization direction of the first fixed layer 31 is reversed. However, the magnetization direction of the storage layer 20 is retained, and the information "1" continues to be stored in the storage layer 20. As a result of the above, the magnetization direction of the storage layer 20 and the magnetization direction of the first fixed layer 31 become opposite, and the storage layer 20 is changed into the high resistance state.

Figure 7A:
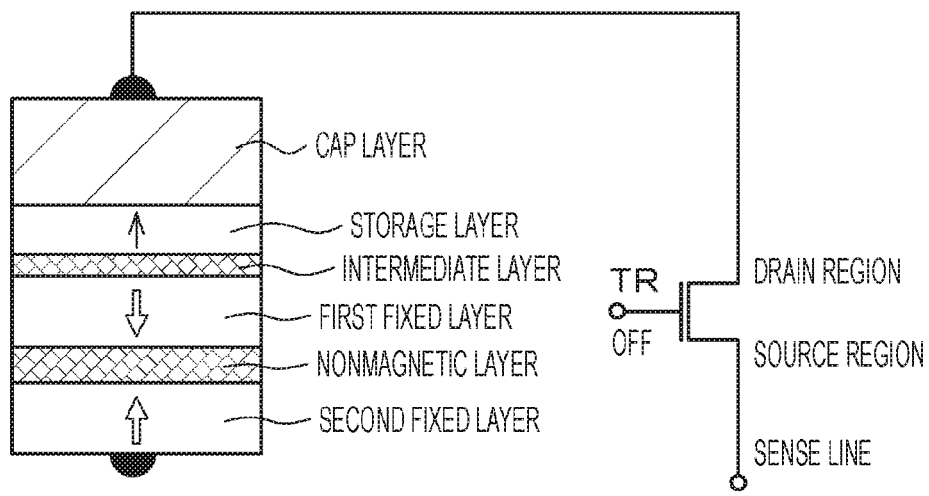
FIGS. 7A and 7B are diagrams schematically illustrating operation states of the nonvolatile memory cell of Embodiment 1.
Figure 7B:
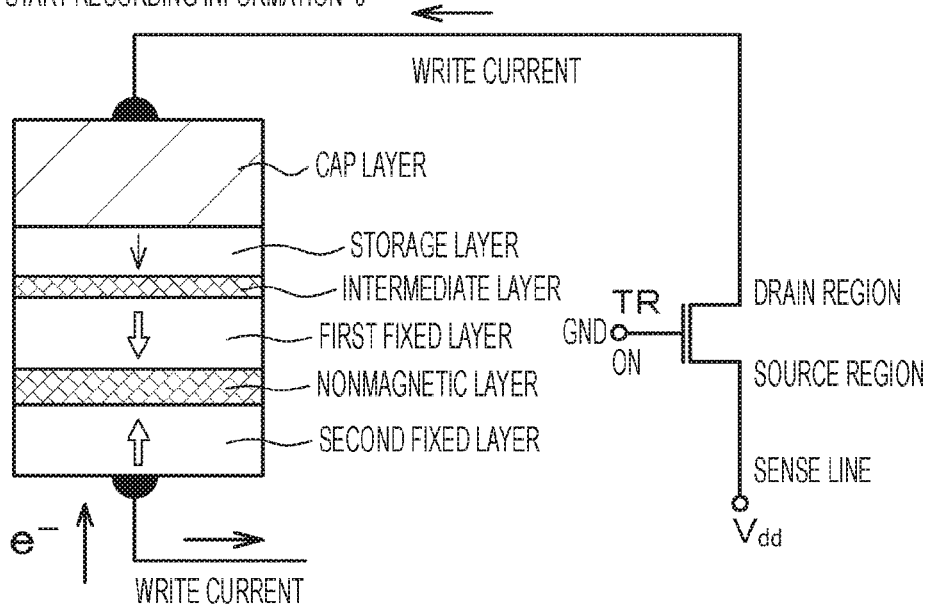
Figure 8A:
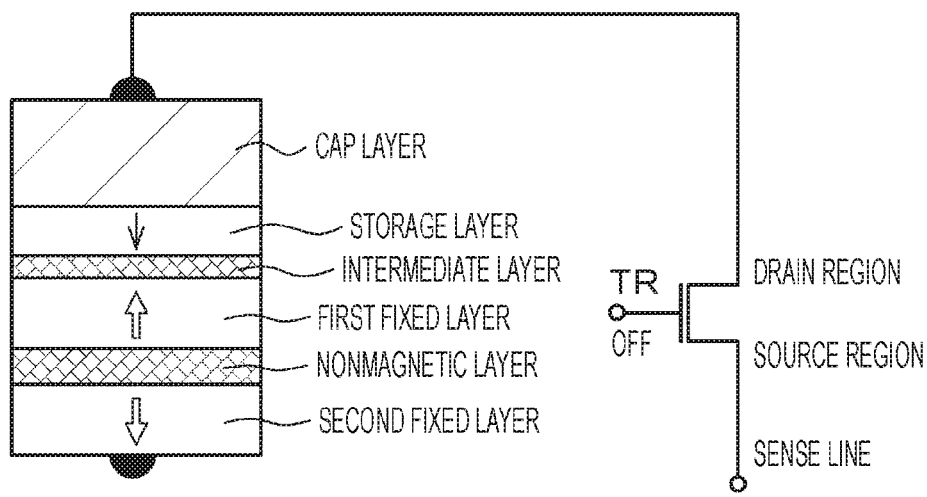
FIGS. 8A and 8B are diagrams schematically illustrating operation states of a modified example of the nonvolatile memory cell of Embodiment 1.
Figure 8B:
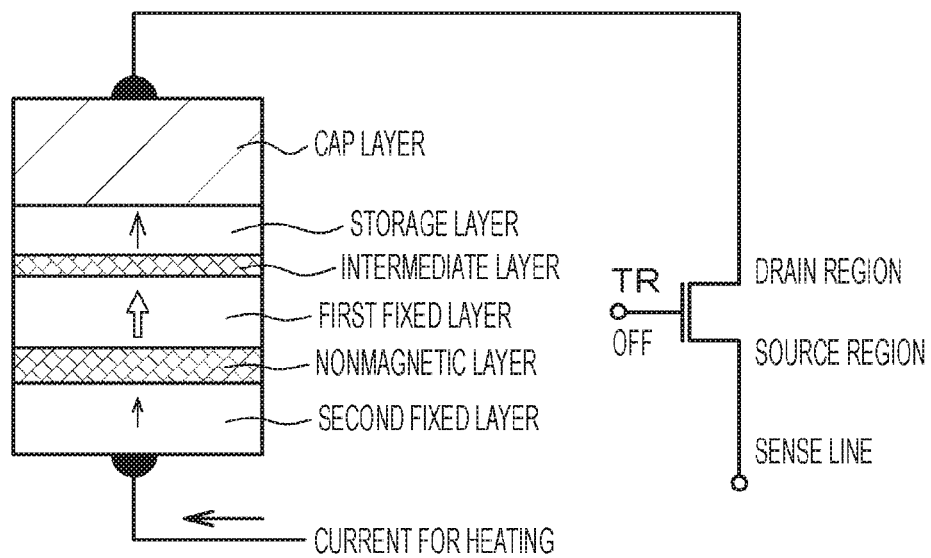

Heating the magnetization fixed layer 30 by the heating layer 40 is stopped after the first information (information "1") is collectively written in the group of the nonvolatile memory cells arrayed along the first direction, and the second information (information "0") is written in a desired nonvolatile memory cell 10 in the group of the nonvolatile memory cells arrayed along the first direction (refer to FIG. 7B). Specifically, heating the magnetization fixed layer 30 is stopped after the first information is collectively written, and the selection transistor (field effect transistor) TR is actuated to write the second information in the desired nonvolatile memory cell 10. Note that write current is made to flow from the storage layer 20 toward the magnetization fixed layer 30 at the time of writing the second information in the nonvolatile memory cell 10. More specifically, electrons are made to flow from the magnetization fixed layer 30 toward the storage layer 20. A value of current made to flow at this point is a current value that is low enough such that the magnetization fixed layer 30 is not heated by the heating layer 40. Specifically, the above-described "writing-2" state is obtained and the second information (Information "0") is written in the storage layer 20 by grounding the heating layer 40 and the heating layer extended portion 41, applying, for example, $V_{dd}$, to the wiring layer 65 (sense line), and applying 0 V to the gate electrode 61 of the selection transistor TR including the PMOS.

At the time of reading information written in a storage layer 20, a selection transistor (field effect transistor) TR in a nonvolatile memory cell from which information is to be read is made to a conductive state. Then, current is made to flow between a bit line BL including a heating layer 40 and a heating layer extended portion 41 and a wiring layer (sense line) 65, and potential generated in the bit line BL is received in the other input unit of a comparator circuit (not illustrated) constituting a comparative circuit (not illustrated). On the other hand, potential from a circuit (not illustrated) that obtains a reference resistance value is received in an input unit on one side of the comparator circuit constituting the comparison circuit. Additionally, in the comparison circuit, comparison is made on whether the potential generated in the bit line BL is higher or lower while setting, as a reference, the potential from the circuit that obtains the reference resistance value, and a comparison result (information 0/1) is output from an output unit of the comparator circuit constituting the comparison circuit.

Hereinafter, an outline of a manufacturing method for a nonvolatile memory cell of Embodiment 1 will be described.

[Step-100]

First, an element isolation region (not illustrated) is formed in a silicon semiconductor substrate 60 based on a known method, and a selection transistor TR including a gate oxide film 62, a gate electrode 61, source/drain regions 64A and 64B are formed in a portion surrounded by the element isolation region in the silicon semiconductor substrate 60. A portion of the silicon semiconductor substrate 60 located between the source/drain region 64A and the source/drain region 64B corresponds to the channel formation region 63. Next, an interlayer insulation layer 68 is formed, a tungsten plug 67D is formed in a portion of the interlayer insulation layer 68 located above the other one 64B of the source/drain regions, and a wiring layer (sense line) 65 is further formed on the interlayer insulation layer 68. After that, an interlayer insulation layer 69 is formed on an entire surface, and a connection hole 67A including a tungsten plug, a landing pad portion 67C, and a connection hole 67B are formed in portions of the interlayer insulation layer 68 and the interlayer insulation layer 69 located above the one 64A of the source/drain regions. Thus, the selection transistor TR covered with the interlayer insulation layers 68 and 69 can be obtained.

[Step-110]

After that, an underlayer 50, a layered structure body 11 (second fixed layer 32, nonmagnetic layer 33, first fixed layer 31, intermediate layer 21, and storage layer 20) and a cap layer 22 are consecutively deposited on the entire surface, and subsequently, the cap layer 22, storage layer 20, and intermediate layer 21 are etched on the basis of a reactive ion etching method (RIE method), thereby obtaining the columnar storage layer 20. Next, a heating layer 40 and a heating layer extended portion 41 can be obtained by etching the first fixed layer 31, nonmagnetic layer 33, second fixed layer 32, and underlayer 50 on the basis of the RIE method. Note that the intermediate layer 21 including a magnesium oxide (MgO) is formed by depositing a MgO layer on the basis of RF magnetron sputtering. Additionally, other layers are deposited by DC magnetron sputtering.

[Step-120]

Next, an insulation material layer 51 is formed on the entire surface, a top surface of the insulation material layer 51 is made to have a level same as that of a top surface of the cap layer 22 by applying planarization processing to the insulation material layer 51. After that, a connection hole 52 connected to the connection hole 67B is provided in the insulation material layer 51, and a connection portion 53 that connects the cap layer 22 and the connection hole 52 is further formed on the insulation material layer 51. Thus, a nonvolatile memory cell (specifically, spin transfer torque based magnetic random access memory) having the structures illustrated in FIGS. 1A, 1B, 2, and 3 can be obtained. Note that each of the layers can also be patterned on the basis of ion milling method (ion beam etching method) instead of patterning each of the layers by the RIE method.

Meanwhile, information is defined by an orientation of a magnetization direction of the storage layer 20 having uniaxial anisotropy. Information writing is performed by making write current flow in the layered direction of the layered structure body 11 and causing spin torque magnetization reversal. Hereinafter, spin torque magnetization reversal will be briefly described with reference to FIGS. 7A and 7B which are conceptual diagrams of a spin transfer torque based magnetic random access memory to which spin injection magnetization reversal is applied. Electrons have two kinds of spin angular momenta. The kinds are provisionally defined as upward and downward. The upward electrons and the downward electrons are the same in the number inside a nonmagnetic body but are different inside a ferromagnetic body.

As described above, in Embodiment 1, provided is the heating layer that controls a magnetization direction of the magnetization fixed layer by heating the magnetization fixed layer. Additionally, the information of "1" or "0" can be written in the nonvolatile memory cell by heating the magnetization fixed layer. In other words, utilizing a difference in temperature dependence of antiferromagnetic coupling between the first fixed layer (reference layer) and the second fixed layer and a difference in temperature dependence of coercive force between the first fixed layer (reference layer) and the second fixed layer, it is possible to perform writing by making current flow in the heating layer from a low resistance state to a high resistance state or from the high resistance state to the low resistance state in the storage state. Additionally, since the above-described writing is performed in all of the nonvolatile memory cells in the first direction sharing the heating layer, writing can be performed collectively. Thus, it is possible to write information by making the current flow in a single direction without making the current flow bidirectionally in the selection transistor. In other words, normal spin injection writing is not performed and collective writing by a magnetic field of the magnetization fixed layer is performed in a direction of the write current having low drive capacity of the selection transistor. On the other hand, normal spin injection writing is performed in a direction of the write current having high drive capacity of the selection transistor. Therefore, it is possible to avoid a problem that: selection transistor is needed to be upsized due to an asymmetry property in which, for example, there is a difference between values of the current flowing in the selection transistor; and a cell area is increased. Additionally, large electric power is not required because the magnetic field of the magnetization fixed layer is utilized for magnetization reversal of the storage layer at the time of collective writing.

Embodiment 2

Figure 10:
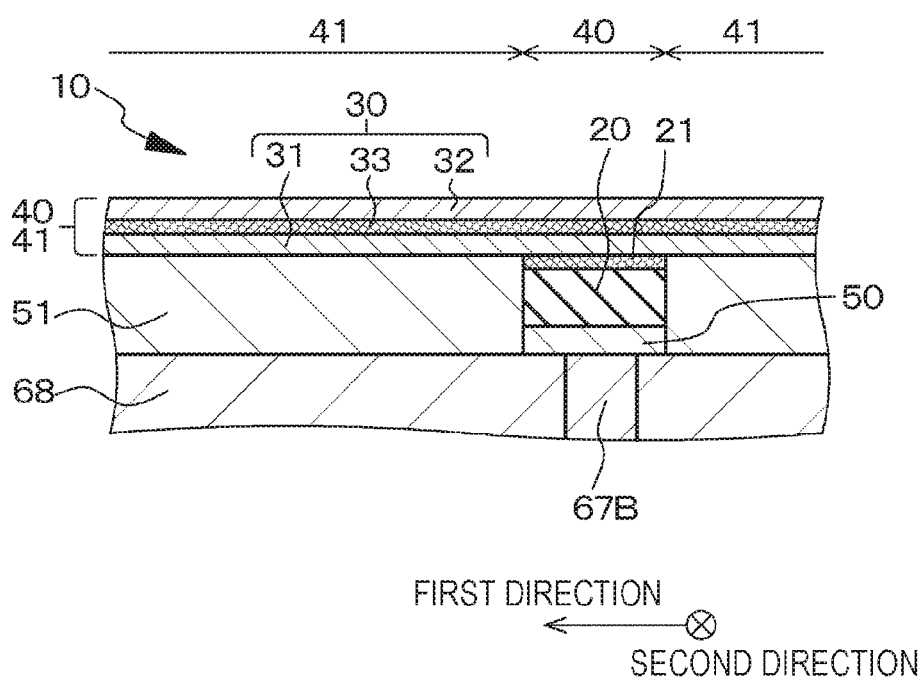
FIG. 10 is a schematic partial cross-sectional view of a nonvolatile memory cell of Embodiment 2 similarly taken along the first direction illustrated in FIG. 1A.
Figure 11:
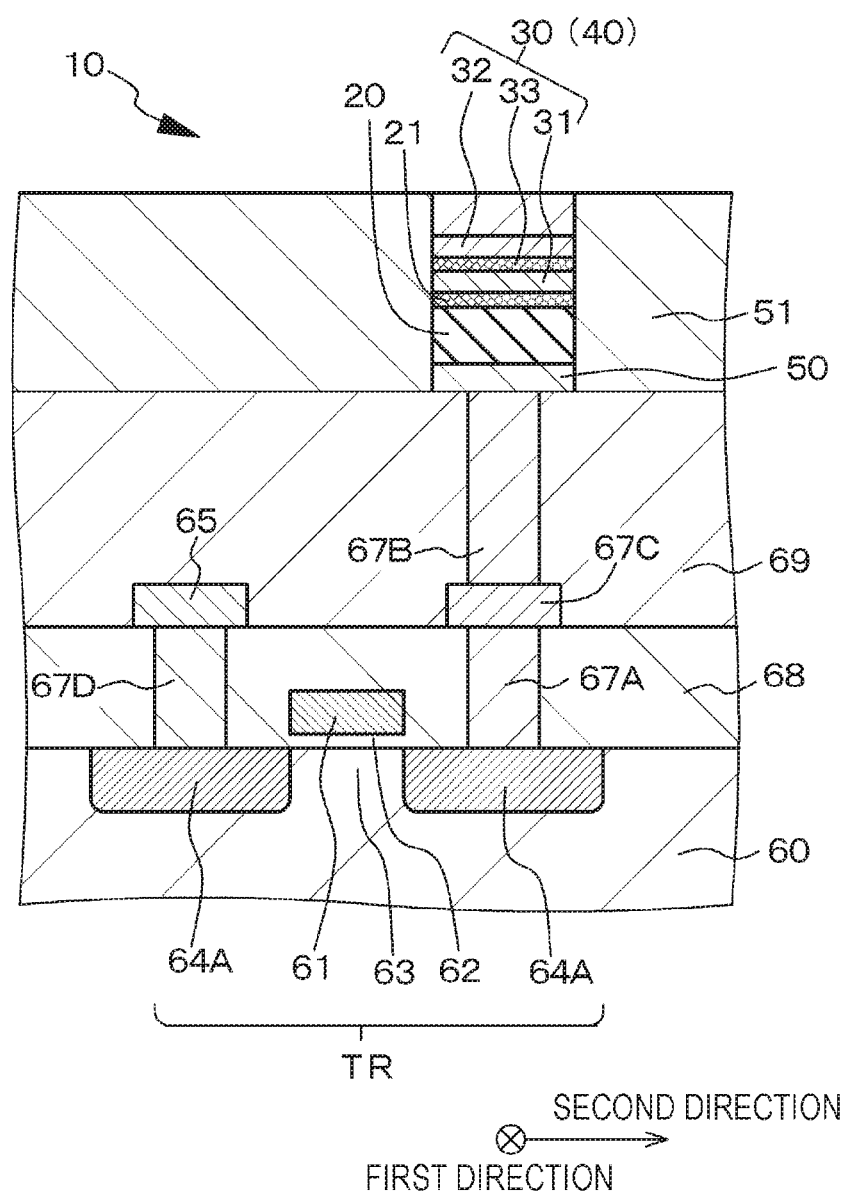
FIG. 11 is a schematic partial cross-sectional view of the nonvolatile memory cell of the Embodiment 2 similarly taken along the second direction illustrated in FIG. 1A.

Embodiment 2 is a modification of Embodiment 1. FIGS. 10 and 11 illustrate schematic partial cross-sectional views of a nonvolatile memory cell of Embodiment 2. Note that FIG. 10 is a schematic partial cross-sectional view similarly taken along the first direction in FIGS. 1A and 1B, and FIG. 11 is a schematic partial cross-sectional view similarly taken along the second direction of FIGS. 1A and 1B. In FIG. 10, illustration of the selection transistor is omitted.

In Embodiment 1, the magnetization fixed layer 30 is provided on the interlayer insulation layer 69. On the other hand, in Embodiment 2, the magnetization fixed layer 30 is provided above the interlayer insulation layer 69. In a vertical arrangement relation between the storage layer 20, the magnetization fixed layer 30, and the selection transistor, the selection transistor (field effect transistor) TR, the storage layer 20, and the magnetization fixed layer 30 are layered sequentially from the lower side. The one 64A of the source/drain regions of the selection transistor TR and the storage layer 20 are connected via: the connection holes 67A and 67B including tungsten provided in interlayer insulation layers 68 and 69; the landing pad portion 67C doped with impurities and including polysilicon; and the underlayer 50.

Except for the points described above, the configuration and the structure of the nonvolatile memory cell of Embodiment 2 can be the similar to the configuration and the structure of the nonvolatile memory cell described of Embodiment 1, and therefore, a detailed description thereof will be omitted.

Embodiment 3

Figure 12:
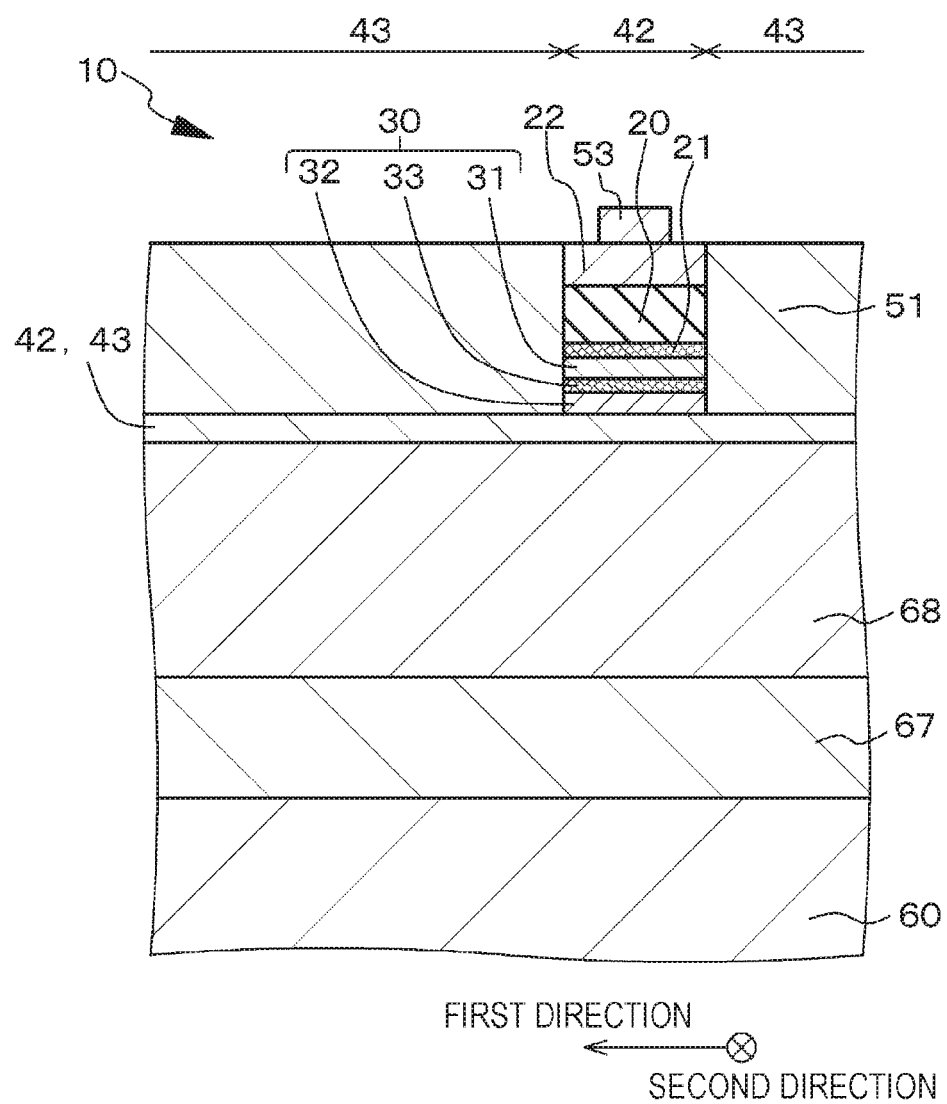
FIG. 12 is a schematic partial cross-sectional view of a nonvolatile memory cell of Embodiment 3 (modified example of Embodiment 1) similarly taken along the first direction illustrated in FIG. 1A.
Figure 13:
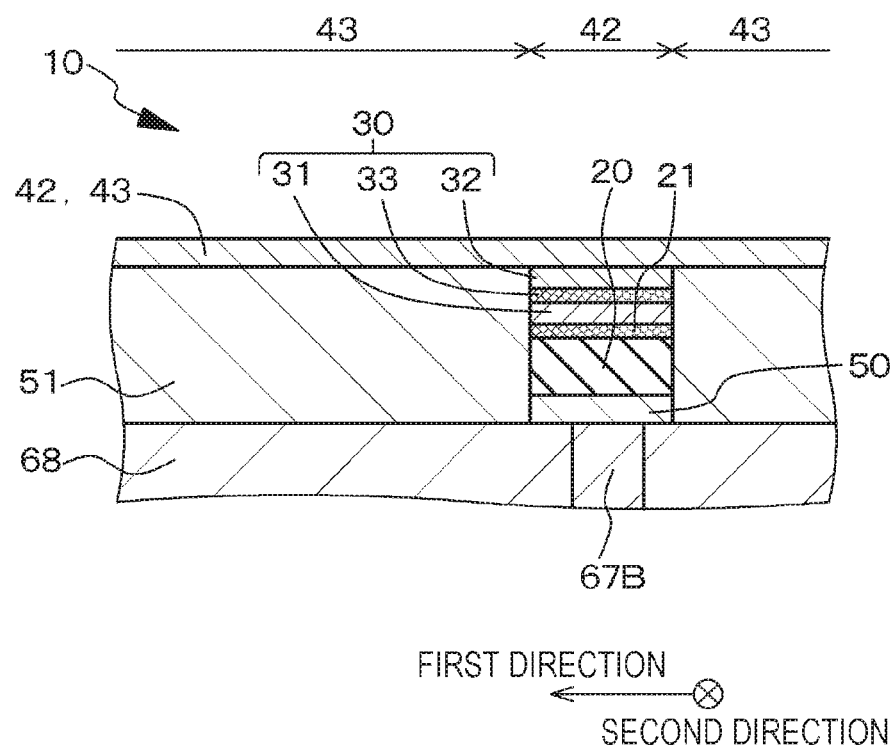
FIG. 13 is a schematic partial cross-sectional view of the nonvolatile memory cell of Embodiment 3 (however, modification of Embodiment 2) similarly taken along the first direction illustrated in FIG. 1A.
Figure 14A:
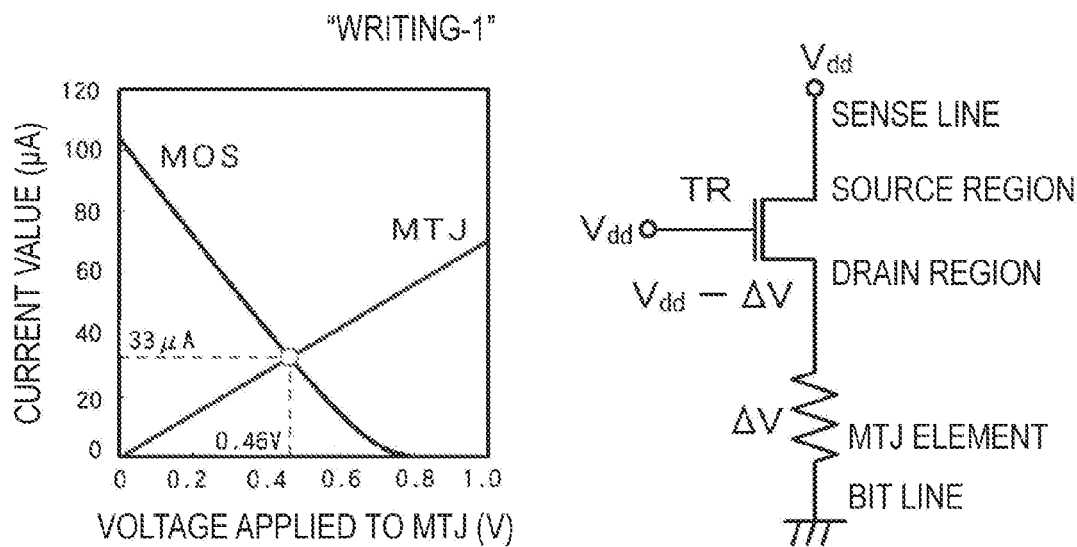
FIG. 14A illustrates an equivalent circuit diagram in "writing-1" in which current flows from a sense line to a bit line and a relation between voltage applied to a spin transfer torque based magnetic random access memory and current flowing in the spin transfer torque based magnetic random access memory and a selection transistor.
Figure 14B:
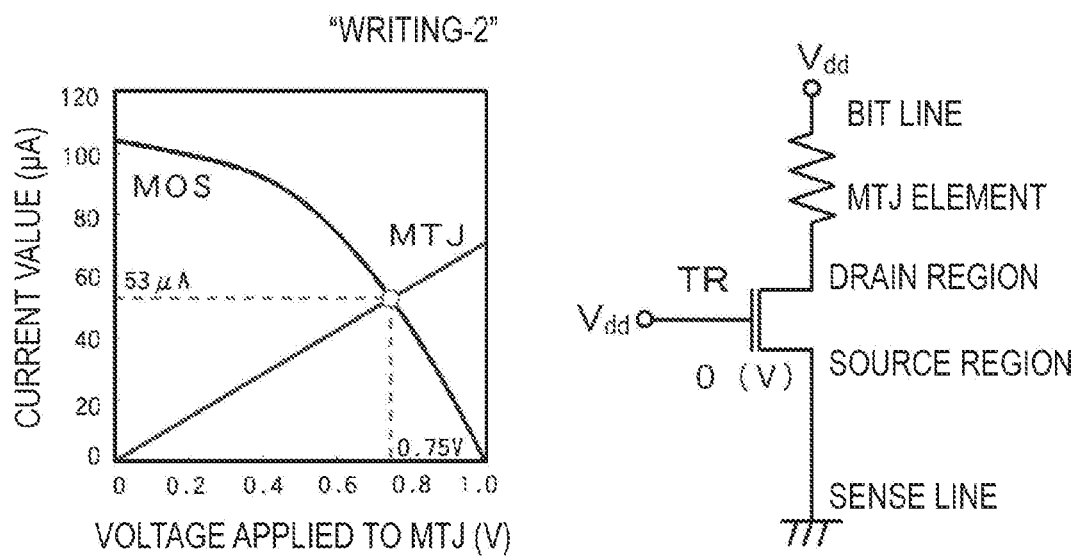
FIG. 14B illustrates an equivalent circuit diagram in "writing-2" in which current flows from the bit line to the sense line and a relation between voltage applied to the spin transfer torque based magnetic random access memory and the current flowing in the spin transfer torque based magnetic random access memory and the selection transistor.

Embodiment 3 is a modification of Embodiments 1 to 2. FIG. 12 (modification of Embodiment 1) and FIG. 13 (modification of Embodiment 2) illustrate schematic partial cross-sectional views of the nonvolatile memory cell of Embodiment 3. Note that FIG. 12 is a schematic partial cross-sectional view similarly taken along the first direction in FIG. 1A, and FIG. 13 is a schematic partial cross-sectional view similarly taken along the first direction of FIG. 1A. In FIG. 13, illustration of the selection transistor is omitted.

In a memory cell unit of Embodiment 3, the heating layer 42 is provided in contact with the magnetization fixed layer 30, and heating layers 42 constituting respective nonvolatile memory cell 10 are connected by heating layer extended portions 43 respectively in a group of the nonvolatile memory cells arrayed along the first direction. Alternatively, in the nonvolatile memory cell 10 of Embodiment 3, the heating layer 42 is provided in contact with the magnetization fixed layer 30, and the heating layers 42 constituting the nonvolatile memory cells 10 are connected by the heating layer extended portion 43 respectively between the nonvolatile memory cells adjacent in one direction. More specifically, the heating layer 42 is provided separately from the magnetization fixed layer 30. Additionally, the magnetization fixed layer 30 is heated by making current flow in the heating layer 42 and the heating layer extended portion 43. Here, the heating layer 42 and the heating layer extended portion 43 are specifically including a material having a high sheet resistance value, such as iron (Fe), platinum (Pt), cobalt (Co), and ruthenium (Ru), for example.

Except for the points described above, the configuration and the structure of the nonvolatile memory cell of Embodiment 3 can be made similar to the configurations and the structures of the nonvolatile memory cells described of Embodiments 1 to 2, and therefore, a detailed description thereof will be omitted.

While the nonvolatile memory cell, memory cell unit, information writing method, and electronic apparatus of the present disclosure have been described on the basis of Embodiments, the present disclosure is not limited to these Embodiments. The configurations and structures of the nonvolatile memory cells and memory cell units described in the Embodiments are examples and can be suitably changed, and examples of materials and the like described in the Embodiments are also examples and can be suitably changed. The voltage applied to the heating layer and the heating layer extended portion, the voltage applied to the gate electrode of the selection transistor and the wiring layer (sense line) are also examples and can be suitably changed, and the current value and the current flowing time to make the current to flow in the heating layer and the heating layer extended portion in order to heat the magnetization fixed layer are also examples and can be suitably changed. The intermediate layer may also be included in the heating layer and the heating layer extended portion.

In Embodiments, the second fixed layer 32 has coercive force larger than the first fixed layer 31 does, but not limited thereto. FIG. 8A, FIG. 8B, FIG. 9A, and FIG. 9B schematically illustrate operation states of the modified example of the nonvolatile memory cell of Embodiment 1, but the first fixed layer 31 may have the coercive force larger than the second fixed layer 32 does. Note that the selection transistor (field effect transistor) TR includes the NMOS but may include a PMOS. For example, in the state illustrated in FIG. 8A, the heating layer 40 generates heat and heats the magnetization fixed layer 30 by making the current flow in the heating layer 40 and the heating layer extended portion 41. Consequently, the temperature of the magnetization fixed layer 30 is increased, and the coercive force of the first fixed layer (reference layer) 31 and that of the second fixed layer 32 are more decreased than those before heating. Thus, the antiferromagnetic coupling between the first fixed layer 31 and the second fixed layer 32 is uncoupled, and the magnetization direction of the first fixed layer 31, the magnetization direction of the second fixed layer 32, and the magnetization direction of the storage layer 20 are made to the same direction (same orientation). In the illustrated examples, the first fixed layer 31 has the coercive force larger than the second fixed layer 32 does. Therefore, the magnetization direction of the first fixed layer 31 and the magnetization direction of the storage layer 20 become the same direction (same orientation) (refer to the conceptual diagram of FIG. 8B). When the current flow in the heating layer 40 and the heating layer extended portion 41 is stopped, the antiferromagnetic coupling between the first fixed layer 31 and the second fixed layer 32 is restored (refer to the conceptual diagram of FIG. 9A). More specifically, the magnetization direction of the first fixed layer 31 remains unchanged, but the magnetization direction of the second fixed layer 32 is reversed. However, the magnetization direction of the storage layer 20 is retained, and the information "0" continues to be stored in the storage layer 20. As a result of the above, the magnetization direction of the storage layer 20 and the magnetization direction of the first fixed layer 31 become the same direction, and the storage layer 20 is changed into the low resistance state.

Figure 9A:
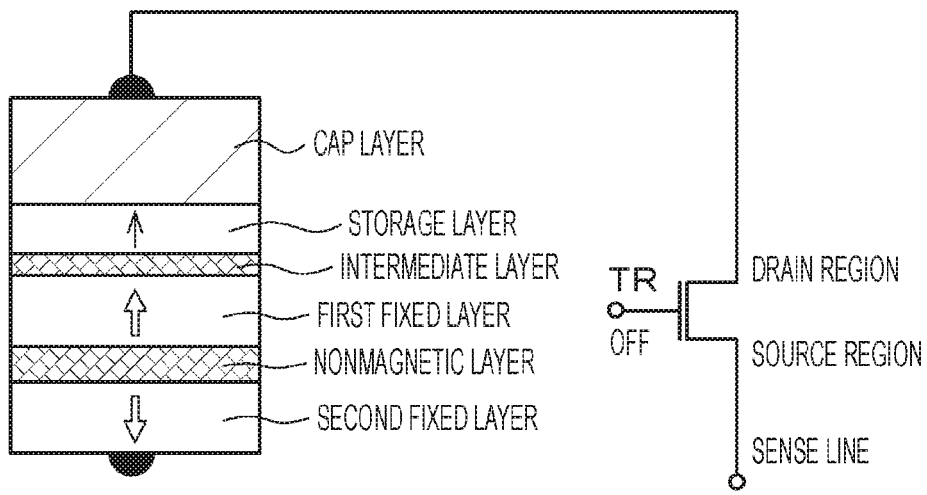
FIGS. 9A and 9B are diagrams schematically illustrating operation states of a modified example of the nonvolatile memory cell of Embodiment 1.
Figure 9B:
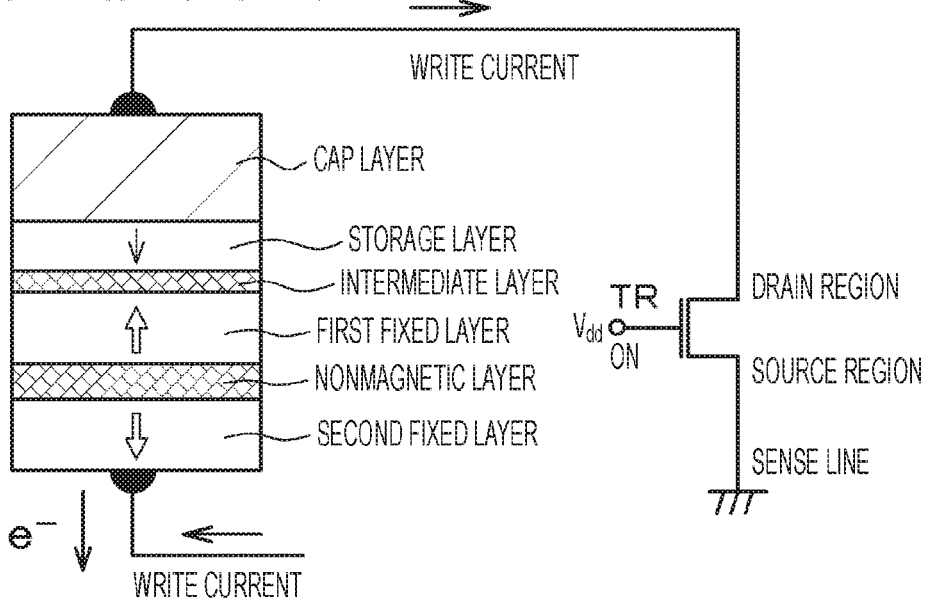

After the first information (information "0") is collectively written in the group of the nonvolatile memory cells arrayed along the first direction, heating the magnetization fixed layer 30 by the heating layer 40 is stopped, and the second information (information "1") is written in a desired nonvolatile memory cell 10 in the group of the nonvolatile memory cells arrayed along the first direction (refer to FIG. 9B). Specifically, heating the magnetization fixed layer 30 is stopped after the first information is collectively written, and the selection transistor (field effect transistor) TR including the NMOS is actuated to write the second information in the desired nonvolatile memory cell 10. Note that write current is made to flow from the magnetization fixed layer 30 toward the storage layer 20 in the nonvolatile memory cell 10 at the time of writing the second information in the nonvolatile memory cell 10. In other words, electrons are made to flow from the storage layer 20 toward the magnetization fixed layer 30. Specifically, the above-described "writing-2" state is obtained and the second information (Information "1") is written in the storage layer 20 by: applying, for example, $V_{dd}$ to the heating layer 40 and the heating layer extended portion 41, and grounding the wiring layer (sense line) 65.

Furthermore, the present disclosure can adopt the following configurations.

[A01] "Memory Cell Unit"

A memory cell unit formed by arraying a plurality of nonvolatile memory cells in a two-dimensional matrix in a first direction and a second direction different from the first direction, in which each of the nonvolatile memory cells includes: a layered structure body formed by layering a storage layer that stores information in accordance with a magnetization direction and a magnetization fixed layer that defines a magnetization direction of the storage layer; and a heating layer that heats the magnetization fixed layer to control a magnetization direction of the magnetization fixed layer.

[A02] The memory cell unit recited in [A01], in which the heating layer includes at least a part of the magnetization fixed layer, heating layers constituting respective nonvolatile memory cells are connected by heating layer extended portions respectively in a group of the nonvolatile memory cells arrayed along the first direction, and the heating layer extended portion has a layer structure same as a layer structure of the heating layer.

[A03] The memory cell unit recited in [A01], in which the heating layer is provided in contact with the magnetization fixed layer, and heating layers constituting respective nonvolatile memory cells are connected by heating layer extended portions respectively in a group of the nonvolatile memory cells arrayed along the first direction.

[A04] The memory cell unit recited in [A02] of [A03], in which the heating layer has a maximum width narrower than an average width of the heating layer extended portions.

[A05] The memory cell unit recited in any one of [A02] to [A04], in which the heating layer and the heating layer extended portion also function as a bit line.

[A06] The memory cell unit recited in any one of [A01] to [A05], in which an intermediate layer is provided between the magnetization fixed layer and the storage layer, the magnetization fixed layer includes a layered structure in which a first fixed layer, a nonmagnetic layer, and a second fixed layer are layered from the intermediate layer side, the first fixed layer and the second fixed layer have antiferromagnetic coupling, and the first fixed layer has coercive force different from coercive force of the second fixed layer at the time of heating the magnetization fixed layer.

[A07] The memory cell unit recited in [A06], in which the antiferromagnetic coupling between the first fixed layer and the second fixed layer is uncoupled by heating the magnetization fixed layer, and a magnetization direction of the first fixed layer, a magnetization direction of the second fixed layer, and a magnetization direction of the storage layer become the same direction (same orientation).

[A08] The memory cell unit recited in [A07], in which a magnetization direction of a fixed layer having larger coercive force out of the first fixed layer and the second fixed layer becomes the same direction (same orientation) as the magnetization direction of the storage layer.

[A09] The memory cell unit recited in any one of [A01] to [A08], in which each of the nonvolatile memory cells further includes a selection transistor including a field effect transistor.

[A10] The memory cell unit recited in [A09], in which the heating layer generates heat by making current flow in the heating layer in a state in which the selection transistor is inactivated.

[A11] The memory cell unit recited in [A09] or [A10], in which the storage layer is connected to one of source/drain regions.

[A12] The memory cell unit according to [A11], in which the other one of the source/drain regions of the selection transistor is connected to a wiring layer.

[A13] The memory cell unit recited in any one of [A09] to [A12], in which a gate electrode of the selection transistor is connected to a word line.

[A14] The memory cell unit according to [A13], in which the word line extends in the second direction.

[A15] The memory cell unit according to any one of [A09] to [A14], in which the layered structure body of each nonvolatile memory cell is provided above the selection transistor via an interlayer insulation layer.

[A16] The memory cell unit recited in any one of [A01] to [A15], in which the nonvolatile memory cell includes a spin transfer torque based magnetic random access memory of a perpendicular magnetization type.

[B01] "Nonvolatile Memory Cell"

A nonvolatile memory cell including: a layered structure body formed by layering a storage layer that stores information in accordance with a magnetization direction and a magnetization fixed layer that defines the magnetization direction of the storage layer; and a heating layer that heats the magnetization fixed layer to control a magnetization direction of the magnetization fixed layer.

[B02] The nonvolatile memory cell recited in [B01], in which the heating layer includes at least a part of each magnetization fixed layer, heating layers constituting respective nonvolatile memory cells are connected by heating layer extended portions respectively between the nonvolatile memory cells adjacent along one direction, and the heating layer extended portion has a layer structure same as a layer structure of the heating layer.

[B03] The nonvolatile memory cell recited in [B01], in which the heating layer is provided in contact with the magnetization fixed layer, and heating layers constituting respective nonvolatile memory cells are connected by heating layer extended portions respectively between the nonvolatile memory cells adjacent along one direction.

[B04] The nonvolatile memory cell recited in [B02] or [B03], in which the heating layer has a maximum width narrower than an average width of the heating layer extended portions.

[B05] The nonvolatile memory cell recited in any one of [B02] to [B04], in which the heating layer and the heating layer extended portion also function as a bit line.

[B06] The nonvolatile memory cell recited in any one of [B01] to [B05], in which an intermediate layer is provided between the magnetization fixed layer and the storage layer, the magnetization fixed layer includes a layered structure in which a first fixed layer, a nonmagnetic layer, and a second fixed layer are layered from the intermediate layer side, the first fixed layer and the second fixed layer have antiferromagnetic coupling, and the first fixed layer has coercive force different from coercive force of the second fixed layer at the time of heating the magnetization fixed layer.

[B07] The nonvolatile memory cell recited in [B06], in which the antiferromagnetic coupling between the first fixed layer and the second fixed layer is uncoupled by heating the magnetization fixed layer, and a magnetization direction of the first fixed layer, a magnetization direction of the second fixed layer, and a magnetization direction of the storage layer become the same direction (same orientation).

[B08] The nonvolatile memory cell recited in [B07], in which a magnetization direction of a fixed layer having larger coercive force out of the first fixed layer and the second fixed layer becomes the same direction (same orientation) as the magnetization direction of the storage layer.

[B09] The nonvolatile memory cell according to any one of [B01] to [B08], further including a selection transistor including a field effect transistor.

[B10] The nonvolatile memory cell recited in [B09], in which the heating layer generates heat by making current flow in the heating layer in a state in which the selection transistor is inactivated.

[B11] The nonvolatile memory cell recited in [B09] or [B10], in which the storage layer is connected to one of source/drain regions.

[B12] The nonvolatile memory cell according to [B11], in which the other one of the source/drain regions of the selection transistor is connected to a wiring layer.

[B13] The nonvolatile memory cell recited in any one of [B09] to [B12], in which a gate electrode of the selection transistor is connected to a word line.

[B14] The nonvolatile memory cell according to [B13], in which the word line extends in a direction different from the one direction.

[B15] The nonvolatile memory cell according to any one of [B09] to [B14], in which the layered structure body is provided above the selection transistor via an interlayer insulation layer.

[B16] The nonvolatile memory cell recited in any one of [B01] to [B15], in which the nonvolatile memory cell includes a spin transfer torque based magnetic random access memory of a perpendicular magnetization type.

[C01] "Information Writing Method"

An information writing method in a memory cell unit formed by arraying a plurality of nonvolatile memory cells in a two-dimensional matrix in a first direction and a second direction different from the first direction, each of the nonvolatile memory cells including a layered structure body formed by layering a storage layer that stores information in accordance with a magnetization direction and a magnetization fixed layer that defines a magnetization direction of the storage layer, the information writing method including writing, in the storage layer, information based on a magnetization direction of the magnetization fixed layer by controlling the magnetization direction of the magnetization fixed layer by heating the magnetization fixed layer.

[C02] The information writing method recited in [C01], in which each of the nonvolatile memory cells includes the heating layer including at least a part of the magnetization fixed layer constituting the layered structure body, heating layers constituting respective nonvolatile memory cells are connected by heating layer extended portions respectively in a group of the nonvolatile memory cells arrayed along the first direction, the heating layer extended portion has a layer structure same as a layer structure of the heating layer, and the magnetization fixed layer is heated by making current flow in the heating layer and the heating layer extended portion.

[C03] The information writing method recited in [C01], in which each of the nonvolatile memory cells has a heating layer provided in contact with the magnetization fixed layer constituting the layered structure body heating layers constituting the respective nonvolatile memory cells are connected by heating layer extended portions respectively in a group of the nonvolatile memory cells arrayed along the first direction, and the magnetization fixed layer is heated by making current flow in the heating layer and the heating layer extended portion.

[C04] The information writing method recited in [C02] or [C03], in which the heating layer has a maximum width narrower than an average width of the heating layer extended portions.

[C05] The information writing method recited in any one of [C02] to [C04], in which the heating layer and the heating layer extended portion also function as a bit line.

[C06] The information writing method recited in [C01] to [C05], including collectively writing first information by heating the magnetization fixed layer in the group of the nonvolatile memory cells arrayed along the first direction.

[C07] The information writing method recited in [C06], including: stopping heating of the magnetization fixed layer by the heating layer after collectively writing the first information in the group of the nonvolatile memory cells arrayed along the first direction; and writing second information in a desired nonvolatile memory cell in the group of the nonvolatile memory cells arrayed along the first direction.

[C08] The information writing method recited in any one of [C01] to [C07], in which an intermediate layer is provided between the magnetization fixed layer and the storage layer, the magnetization fixed layer includes a layered structure in which a first fixed layer, a nonmagnetic layer, and a second fixed layer are layered from the intermediate layer side, the first fixed layer and the second fixed layer have antiferromagnetic coupling, and the first fixed layer has coercive force different from coercive force of the second fixed layer at the time of heating the magnetization fixed layer.

[C09] The information writing method recited in [C08], including: uncoupling the antiferromagnetic coupling between the first fixed layer and the second fixed layer by heating the magnetization fixed layer; and making a magnetization direction of the first fixed layer and a magnetization direction of the second fixed layer to the same direction (same orientation) as a magnetization direction of the storage layer.

[C10] The information writing method recited in [C09], in which a magnetization direction of a fixed layer having larger coercive force out of the first fixed layer and the second fixed layer becomes the same direction (same orientation) as the magnetization direction of the storage layer.

[C11] The information writing method recited in any one of [C01] to [C10], in which each of the nonvolatile memory cells further includes a selection transistor including a field effect transistor.

[C12] The information writing method recited in [C11], including: making the heating layer generate heat by making current flow in the heating layer in a state in which the selection transistor is inactivated; and writing the first information in a nonvolatile memory cell.

[C13] The information writing method recited in [C12], including: stopping heating the magnetization fixed layer after writing the first information; and writing the second information in a desired nonvolatile memory cell by actuating the selection transistor.

[C14] The information writing method recited in [C13], including making current flow from the storage layer toward the magnetization fixed layer in the nonvolatile memory cell at the time of writing the second information in the nonvolatile memory cell.

[C15] The information writing method recited in any one of [C11] to [C14], in which the storage layer is connected to one of the source/drain regions.

[C16] The information writing method recited in [C15], in which the other one of the source/drain regions of the selection transistor is connected to a wiring layer.

[C17] The information writing method recited in any one of [C11] to [C16], in which a gate electrode of the selection transistor is connected to a word line.

[C18] The information writing method recited in [C17], in which the word line extends in the second direction.

[C19] The information writing method recited in any one of [C11] to [C18], in which the layered structure body of each nonvolatile memory cells is provided above the selection transistor via an interlayer insulation layer.

[C20] The information writing method recited in any one of [C01] to [C19], in which the nonvolatile memory cell includes a spin transfer torque based magnetic random access memory of a perpendicular magnetization type.

[D01] "Electronic Apparatus"

An electronic apparatus including a memory cell unit recited in any one of [A01] to [A16].

REFERENCE SIGNS LIST

10 Nonvolatile memory cell
11 Layered structure body
20 Storage layer
21 Intermediate layer
22 Cap layer
30 Magnetization fixed layer
31 First fixed layer
32 Second fixed layer
33 Nonmagnetic layer
40, 42 Heating layer
41, 43 Heating layer extended portion
50 Underlayer
51 Insulation material layer
52 Connection hole
53 Connection portion
61 Gate electrode
62 Gate insulation layer
63 Channel formation region
64A One of source/drain regions
64B The other one of source/drain regions
65 Wiring layer (sense line)
67A, 67B Connection hole
67C Landing pad portion
68, 69 Interlayer insulation layer
TR Selection transistor (field effect transistor)
BL Bit line
WL Word line

The invention claimed is:

1. A memory cell unit, comprising:
an array of a plurality of nonvolatile memory cells in a two-dimensional matrix in a first direction and a second direction different from the first direction,
wherein each nonvolatile memory cell of the plurality of nonvolatile memory cells comprises:
a layered structure body comprising:
a storage layer configured to store information based on a magnetization direction; and
a magnetization fixed layer configured to define the magnetization direction of the storage layer; and
a heating layer configured to:
heat the magnetization fixed layer; and
control a magnetization direction of the magnetization fixed layer based on the heated magnetization fixed layer, wherein
the heating layer includes at least a part of the magnetization fixed layer,
heating layers that constitute a respective nonvolatile memory cell of the plurality of nonvolatile memory cells are connected by heating layer extended portions respectively in a group of the plurality of nonvolatile memory cells arrayed along the first direction, and
the heating layer extended portions have a layer structure same as a layer structure of the heating layer.

2. The memory cell unit according to claim 1, wherein the heating layer has a maximum width narrower than an average width of the heating layer extended portions.

3. The memory cell unit according to claim 1, wherein the heating layer and the heating layer extended portions are configured to function as a bit line.

4. The memory cell unit according to claim 1, further comprising an intermediate layer between the magnetization fixed layer and the storage layer, wherein
the magnetization fixed layer includes a layered structure in which a first fixed layer, a nonmagnetic layer, and a second fixed layer are layered from the intermediate layer side,
the first fixed layer and the second fixed layer have antiferromagnetic coupling, and
the first fixed layer has coercive force different from coercive force of the second fixed layer at a time the magnetization fixed layer is heated.

5. The memory cell unit according to claim 4, wherein
the antiferromagnetic coupling between the first fixed layer and the second fixed layer is uncoupled by heating the magnetization fixed layer, and
a magnetization direction of the first fixed layer, a magnetization direction of the second fixed layer, and the magnetization direction of the storage layer become the same direction.

6. The memory cell unit according to claim 5, wherein a magnetization direction of a fixed layer having larger coercive force out of the first fixed layer and the second fixed layer becomes the same direction as the magnetization direction of the storage layer.

7. The memory cell unit according to claim 1, wherein each nonvolatile memory cell of the plurality of nonvolatile memory cells further includes a selection transistor including a field effect transistor.

8. The memory cell unit according to claim 7, wherein the heating layer is further configured to generate heat based on current that flows in the heating layer in a state in which the selection transistor is inactivated.

9. The memory cell unit according to claim 7, wherein the storage layer is connected to one of a source region or a drain region of the selection transistor.

10. The memory cell unit according to claim 7, wherein a gate electrode of the selection transistor is connected to a word line.

11. The memory cell unit according to claim 1, wherein each nonvolatile memory cell of the plurality of nonvolatile memory cells further includes a spin transfer torque based magnetic random access memory of a perpendicular magnetization type.

12. A nonvolatile memory cell, comprising:
a layered structure body comprising:
a storage layer configured to store information in based on a magnetization direction; and
a magnetization fixed layer configured to define the magnetization direction of the storage layer; and
a heating layer configured to:
heat the magnetization fixed layer; and
control a magnetization direction of the magnetization fixed layer, wherein
the heating layer includes at least a part of the magnetization fixed layer,
heating layers that constitute a respective nonvolatile memory cell of a plurality of nonvolatile memory cells are connected by heating layer extended portions respectively in a group of the plurality of nonvolatile memory cells arrayed along a first direction of an array of the plurality of nonvolatile memory cells, and
the heating layer extended portions have a layer structure same as a layer structure of the heating layer.

13. An information writing method in a memory cell unit, the information writing method comprising:
controlling a magnetization direction of a magnetization fixed layer by heating the magnetization fixed layer, wherein
the memory cell unit comprises an array of a plurality of nonvolatile memory cells in a two-dimensional matrix in a first direction and a second direction different from the first direction,
each nonvolatile memory cell of the plurality of nonvolatile memory cells comprises:
a layered structure body comprising the magnetization fixed layer and a storage layer configured to store information based on a magnetization direction of the storage layer; and
a heating layer configured to heat the magnetization fixed layer,
the magnetization fixed layer is configured to define the magnetization direction of the storage layer,
the heating layer includes at least a part of the magnetization fixed layer,
heating layers that constitute a respective nonvolatile memory cell of the plurality of nonvolatile memory cells are connected by heating layer extended portions respectively in a group of the plurality of nonvolatile memory cells arrayed along the first direction,
the heating layer extended portions have a layer structure same as a layer structure of the heating layer, and
the magnetization fixed layer is heated by making current flow in the heating layer and the heating layer extended portions; and writing, in the storage layer, information based on the magnetization direction of the magnetization fixed layer.

14. The information writing method according to claim 13, further comprising collectively writing first information by heating the magnetization fixed layer in the group of the plurality of nonvolatile memory cells arrayed along the first direction.

15. The information writing method according to claim 14, further comprising:
    stopping heating of the magnetization fixed layer by the heating layer after collectively writing the first information in the group of the plurality of nonvolatile memory cells arrayed along the first direction; and
    writing second information in a desired nonvolatile memory cell in the group of the plurality of nonvolatile memory cells arrayed along the first direction.

16. An electronic apparatus, comprising:
    a memory cell unit, wherein the memory cell unit comprises:
        an array of a plurality of nonvolatile memory cells in a two-dimensional matrix in a first direction and a second direction different from the first direction,
        wherein each nonvolatile memory cell of the plurality of nonvolatile memory cells comprises:
            a layered structure body comprising:
                a storage layer configured to store information based on a magnetization direction; and
                a magnetization fixed layer configured to define the magnetization direction of the storage layer; and
            a heating layer configured to:
                heat the magnetization fixed layer; and
                control a magnetization direction of the magnetization fixed layer based on the heated magnetization fixed layer, wherein
            the heating layer includes at least a part of the magnetization fixed layer,
            heating layers that constitute a respective nonvolatile memory cell of the plurality of nonvolatile memory cells are connected by heating layer extended portions respectively in a group of the plurality of nonvolatile memory cells arrayed along the first direction, and
            the heating layer extended portions have a layer structure same as a layer structure of the heating layer.

* * * * *